(12) United States Patent
Yano et al.

(10) Patent No.: US 7,793,189 B2
(45) Date of Patent: Sep. 7, 2010

(54) ERROR CONTROL APPARATUS

(75) Inventors: Tetsuya Yano, Kawasaki (JP); Kazuhisa Obuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1176 days.

(21) Appl. No.: 11/087,251

(22) Filed: Mar. 23, 2005

(65) Prior Publication Data

US 2005/0166129 A1 Jul. 28, 2005

Related U.S. Application Data

(63) Continuation of application No. PCT/JP03/03402, filed on Mar. 20, 2003.

(51) Int. Cl.
*H04L 1/18* (2006.01)
(52) U.S. Cl. .............. 714/748; 714/758; 714/751; 714/768; 714/799; 714/764
(58) Field of Classification Search .......... 714/748, 714/758, 774, 751, 766, 768, 797; 375/346
See application file for complete search history.

(56) References Cited

U.S. PATENT DOCUMENTS 5,265,122 A * 11/1993 Rasky et al. ............. 375/346

| | | | |
|---|---|---|---|
| 6,977,888 B1 * | 12/2005 | Frenger et al. | 370/218 |
| 7,076,204 B2 * | 7/2006 | Richenstein et al. | 455/3.06 |
| 2003/0014712 A1 | 1/2003 | Yano et al. | |
| 2003/0112879 A1 * | 6/2003 | Antia et al. | 375/259 |
| 2004/0064778 A1 * | 4/2004 | Widdup | 714/758 |

FOREIGN PATENT DOCUMENTS

| | | |
|---|---|---|
| JP | 9-214474 | 8/1997 |
| JP | 2000-278144 | 10/2000 |
| JP | 2001-119426 | 4/2001 |
| JP | 2002-190745 | 7/2002 |
| JP | 2003-018022 | 1/2003 |
| JP | 2003-023359 | 1/2003 |
| WO | WO 02/052733 | 7/2002 |

* cited by examiner

*Primary Examiner*—Fritz Alphonse
(74) *Attorney, Agent, or Firm*—Katten Muchin Rosenman LLP

(57) ABSTRACT

In an error control apparatus on a receiving side using a hybrid ARQ which combines an error correcting encoding method and an automatic repeat request method, a buffer stores hard decision result data or soft output data instead of soft decision information in order to reduce a memory capacity of the buffer, and re-encodes the data stored to be provided to a combiner. Alternatively, the number of bits of the data stored in the buffer is restricted or a memory included in a decoder is used as an HARQ buffer.

17 Claims, 34 Drawing Sheets

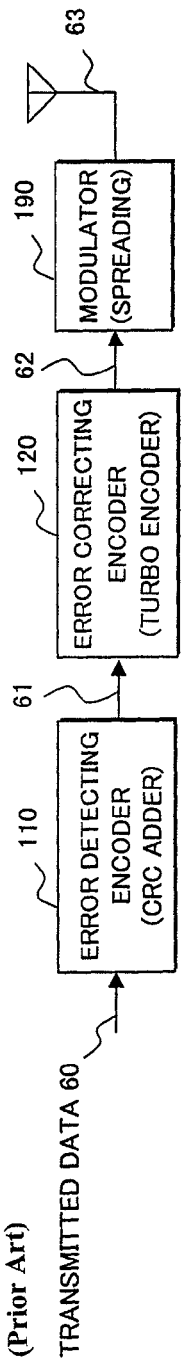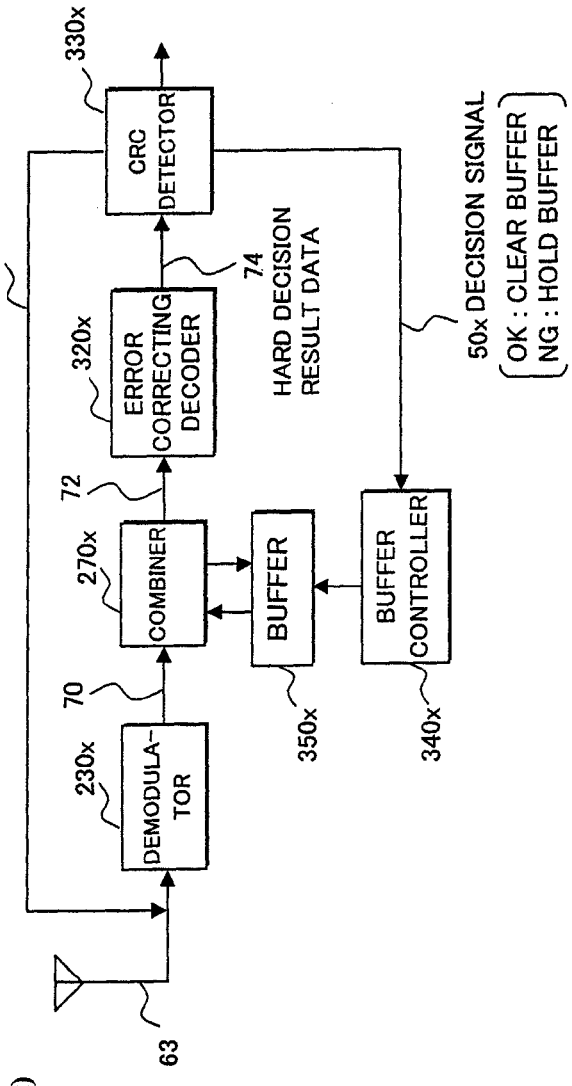
FIG.29A (Prior Art)
FIG.29B (Prior Art)

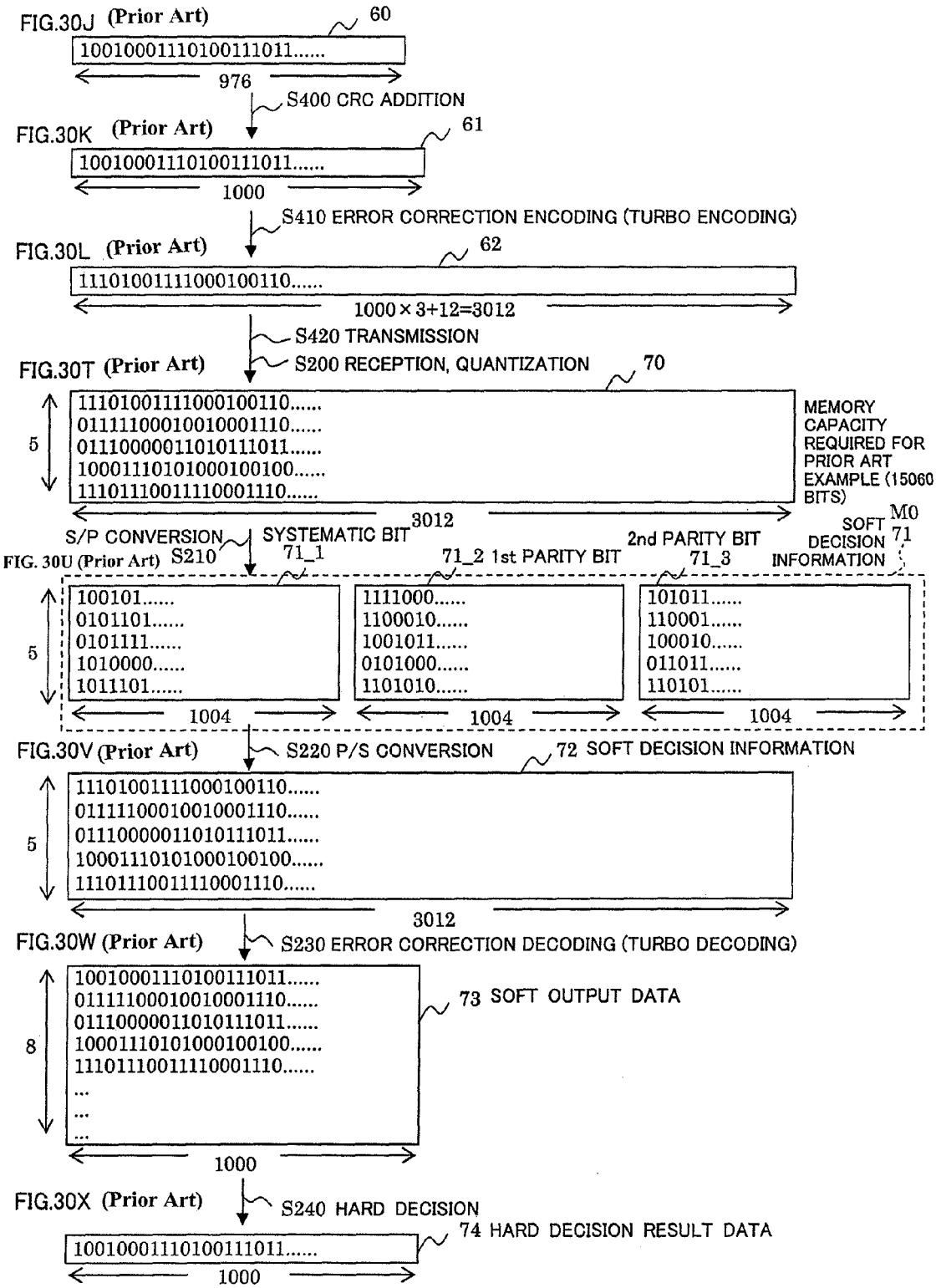

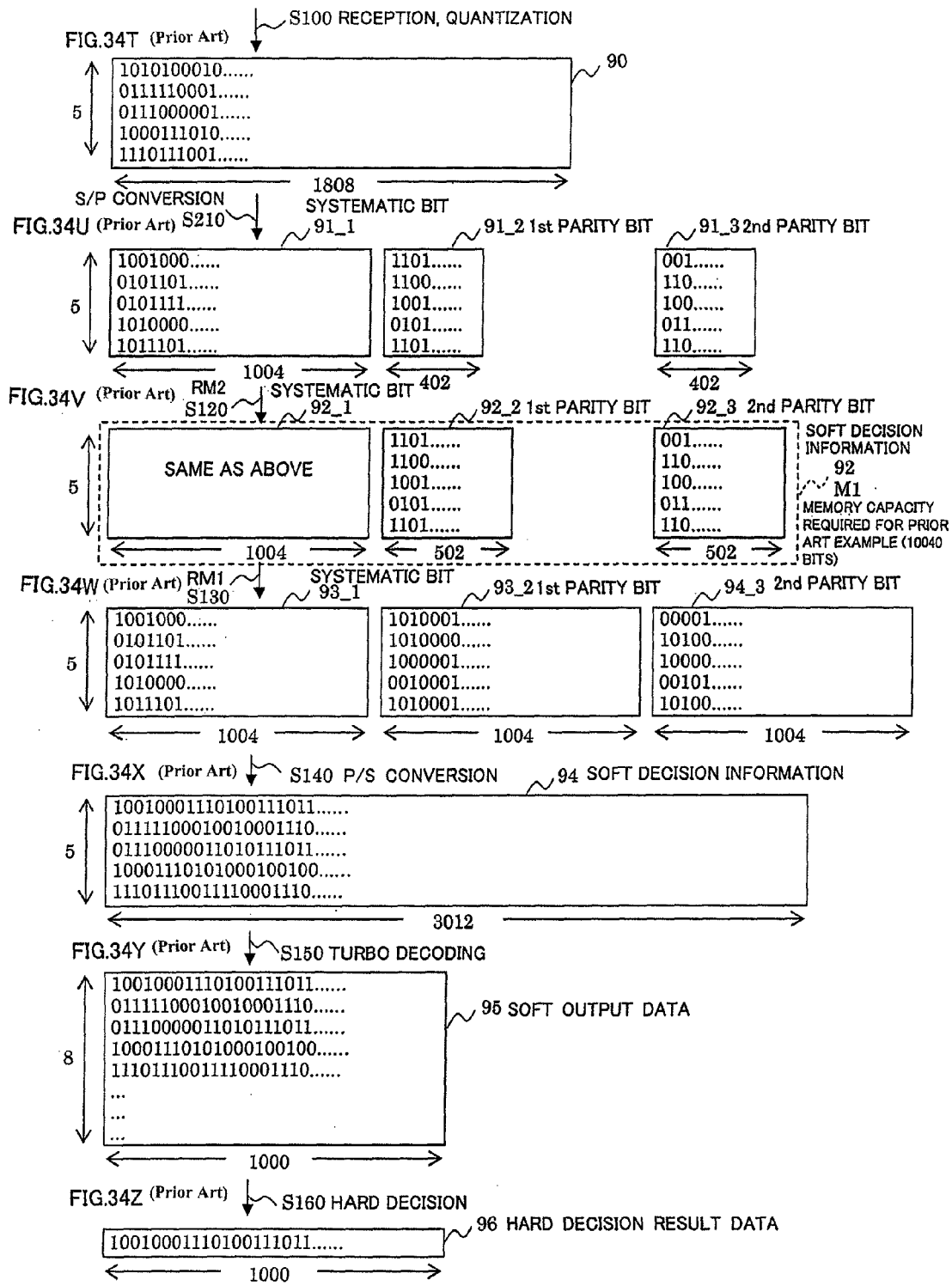

ERROR CONTROL APPARATUS

CROSS-REFERENCE TO RELATED APPLICATION

This application is a continuation of International Application PCT/JP03/03402, filed on Mar. 20, 2003, now pending, the contents of which are herein wholly incorporated by reference.

BACKGROUND OF THE INVENTION

1. Field of the Invention

The present invention relates to an error control apparatus, and in particular to an error control apparatus on a receiving side using a Hybrid Automatic Repeat reQuest (hereinafter, occasionally abbreviated as HARQ) which combines a Forward Error Correction (FEC) method and an ARQ method.

Recently, together with a rapid development of a communication technology, a data communication has been used in all of the fields, which has made reliability of the data communication more and more important.

2. Description of the Related Art

As an error control method of a data communication, there are following methods: (1) an error correcting method by which communication data are encoded into an error correcting code on a transmitting side (end), and the error correcting code is decoded on a receiving side (end) to obtain the communication data; and (2) an ARQ method by which communication data are encoded into an error detecting code on the transmitting side and an error is detected based on the error detecting code on the receiving side to perform a repeat request of the communication data when the error is detected.

Generally, the error correcting method (1) is used in many cases to reduce a Bit Error Rate (BER) in a communication for which real time performance is required for in a voice communication. On the other hand, the ARQ method (2) is used for the data communication in which high reliability is required for in a file transfer but a delay is permitted to some extent.

Also, for performing a more efficient error control, a HARQ combining the error correcting method (1) and the ARQ method (2) is used.

In a 3GPP (third Generation Partnership Project) in which W-CDMA that is one of the third generation mobile communication methods is standardized, the use of the HARQ as an error control technology of an HSDPA (High Speed Downlink Packet Access) which performs a high-speed data communication is standardized.

FIGS. 29A and 29B show an arrangement of a general error control apparatus using the HARQ. This arrangement is not provided with an interleaving and a rate matching functions. FIG. 29A shows an arrangement of a transmitting side error control apparatus $100x$.

The error control apparatus $100x$ is composed of an error detecting encoder 110, an error correcting encoder 120 and a modulator 190. It is to be noted that for the error detecting encoder 110 and the error correcting encoder 120, e.g. a CRC adder 110 and a turbo encoder 120 may be used.

FIGS. 30J-30L show data examples in the transmitting side error control apparatus $100x$. The operation example of the transmitting side error control apparatus $100x$ shown in FIG. 29A will now be described referring to FIGS. 30J-30L.

The error detecting encoder 110 outputs transmission data 60 (see FIG. 30J) to which an error detection encoding is performed, e.g. error detecting encoded data 61 (see FIG. 30K) to which an error detecting CRC code is added. The error correcting encoder 120 performs turbo-encoding to the data 61 to obtain e.g. error correcting encoded data 62 (see FIG. 30L). The modulator 190 transmits the data 62, e.g. modulated data 63 to which a spreading modulation processing is performed, to a wireless line (in FIG. 30L) or a wired line.

FIG. 29B shows an arrangement of a receiving side error control apparatus $200x$. This error control apparatus $200x$ is provided with a demodulator $230x$, a combiner (merging portion) $270x$, an error correcting decoder $320x$ and a code error detector (CRC detector) $330x$ connected in series.

Also, the error control apparatus $200x$ is further provided with a buffer $350x$ connected to the combiner $270x$ and a buffer controller $340x$ connected to the buffer $350x$ and the code error detector $330x$.

FIGS. 30T-30X show data examples in the receiving side error control apparatus $200x$. The operation of the error control apparatus $200x$ will now be described referring to FIGS. 30T-30X.

In the error control apparatus $200x$, the demodulator $230\times$ demodulates the received modulated data 63 into demodulated data 70 (see FIG. 30T) quantized. The demodulated data 70 are provided to the combiner $270x$.

The combiner $270x$ provides, to the error correcting decoder $320x$, soft decision information 72 in which data preliminarily stored in the buffer $350x$ (see FIG. 30U; if the number of quantized bits is supposed to be e.g. 5 bits, a required memory capacity of the buffer is M0=15060 bits) and the demodulated data 70 (see FIG. 30V) are combined or merged.

It is to be noted that FIGS. 30U and 30V show the data examples in a case where a S/P converter (not shown) is inserted between the demodulator $230x$ and the combiner $270x$ of FIG. 29A and a P/S converter (not shown) is inserted between the combiner $270x$ and the error correcting decoder $320x$.

In these data examples, the demodulated data 70 (see FIG. 30T) are series-parallel-converted into systematic bit series data 71_1, first parity bit series data 71_2 and second parity bit series data 71_3 (see FIG. 30U; hereinafter, occasionally referred to as systematic bit 71_1, first parity bit 71_2 and second parity bit 71_3) by the S/P converter (not shown). Then, the data are parallel-series-converted into soft decision information 72 by the P/S converter (not shown) after processing at the combiner $270x$.

The error correcting decoder $320x$ performs decoding for correcting a code error of the soft decision information 72 to output soft output data 73 (see FIG. 30W) and hard decision result data 74 (see FIG. 30X).

When the code error detector $330x$ detects a code error of the hard decision result data 74 in which the code error should have been corrected and that the data have an error, the code error detector $330x$ transmits a data retransmission request 75 to the transmitting side error control apparatus $100x$, requests the transmitting side error control apparatus $100x$ to retransmit the data, and provides the buffer controller $340x$ with a "NG" decision signal $50x$ indicating that the data have a code error.

Also, in the absence of an error, the code error detector $330x$ provides the buffer controller $340x$ with an "OK" decision signal $50x$ indicating that the data have no error. When the decision signal $50x$ is "OK", the buffer controller $340x$ clears the buffer $350x$ and when the decision signal $50x$ is "NG", the buffer controller $340x$ holds the buffer $350x$.

FIG. 31 shows an arrangement of a transmitting side error control apparatus $100y$ performing a HARQ encoding processing in the 3GPP. This error control apparatus $100y$ is different from the error control apparatus 100x shown in FIG. 29A in that a bit separator 130, a first rate matching portion 140, a virtual IR buffer 150, a second rate matching portion 160 and an HS-DSCH interleaver 180, which are all connected in series, are provided between the error correcting encoder 120 and the modulator 190.

The first rate matching portion 140 is composed of an RM_P1_1 portion 141 and an RM_P2_1 portion 142 respectively performing a rate matching of a first parity bit 83_2 and a second parity bit 83_3.

The second rate matching portion 160 is composed of an RM_S portion 161, an RM_P1_2 portion 162 and an RM_P2_2 portion 163 respectively performing the rate matching of a systematic bit 84_1, a first parity bit 84_2 and a second parity bit 84_3.

FIGS. 32J-32P show data examples in the transmitting side error control apparatus 100y. The data examples are ones of the HARQ encoding processing in the 3GPP, and a turbo code is used as an error correcting code.

The operation of the error control apparatus 100y will now be described referring to the data examples.

The CRC adder (error detecting encoder) 110 performs CRC addition processing, and outputs error detecting encoded data 81 (see FIG. 32K) which are transmission data 80 (see FIG. 32J) to which the error detecting CRC code is added. The turbo encoder 120 outputs turbo encoded data 82 (see FIG. 32L) which are the encoded data 81 to which the error correction encoding is performed.

The bit separator 130 separates the error correction encoded data 82 into systematic bit series data 83_1, the first parity bit series data 83_2 and the second parity bit series data 83_3 (see FIG. 32M; hereinafter occasionally referred to as systematic bit, first parity bit and second parity bit respectively).

The first rate matching portion 140 outputs the systematic bit series data 84_1, the first parity bit series data 84_2 and the second parity bit series data 84_3 (see FIG. 32N; hereinafter occasionally referred to as systematic bit, first parity bit and second parity bit respectively) in which the transmission rates of the systematic bit 83_1, the first parity bit 83_2 and the second parity bit 83_3 are adjusted.

The virtual IR buffer 150 temporarily stores the systematic bit 84_1, the first parity bit 84_2 and the second parity bit 84_3.

The bit collector 170 takes predetermined systematic bit series data 85_1, first parity bit series data 85_2 and second parity bit series data 85_3 (see FIG. 32O), by second rate matching, out of the systematic bit 84_1, the first parity bit 84_2 and the second parity bit 84_3 stored in the virtual IR buffer 150, and outputs encoded data 86 (see FIG. 32P) in which bits are collected.

The interleaver 180 outputs data (not shown in FIGS. 32J-32P) which are the encoded data 86 interleaved, so that the modulator 190 outputs data which are the output data of the interleaver 180 modulated.

It is to be noted that the virtual IR buffer 150 is for holding data to be retransmitted, and the memory capacity thereof is variable according to the performance on the receiving side. In this example, a value (2008 bits) corresponding to the half of the encoding ratio is used.

FIG. 33 shows an arrangement of a prior art error control apparatus 200y on a receiving side. The error control apparatus 200y receives data 88 transmitted by the transmitting side error control apparatus 100y shown in FIG. 31.

The error control apparatus 200y is different from the error control apparatus 200x shown in FIG. 29B in that de-spreaders 210y_1-210y_n (hereinafter, occasionally represented by a reference numeral 210y) connected in parallel and a rake combiner 220y connected to the de-spreaders 210y are connected to the previous stage of a demodulator 230y, a deinterleaver 240y, a bit separator 250y and a second rate matching portion 260y connected in series are inserted between the demodulator 230y and a combiner 270y, and a first rate matching portion 280y and a bit collector 290y connected in series are inserted between the combiner 270y and an error connecting decoder 320y.

The second rate matching portion 260y are composed of an RM_S portion 261, an RM_P1_2 portion 262 and an RM_P2_2 portion 263 performing a rate matching of a systematic bit 91_1, a first parity bit 91_2 and a second parity bit 91_3 respectively.

The first rate matching portion 280y are composed of an RM_P1_1 portion 281 and an RM_P2_1 portion 282 performing a rate matching of a first parity bit 92_2 and a second parity bit 92_3 respectively.

FIGS. 34T-34Z show data examples in the receiving side error control apparatus 200y. The data examples are ones prescribed by the 3GPP, and the turbo code is used as an error correcting code.

The operation of the error control apparatus 200y will now be described referring to the data examples in FIGS. 34T-34Z.

In the error control apparatus 200y, a de-spreading processing, rake combining processing, a demodulation processing and a deinterleave processing are respectively performed to the received data by the de-spreader 210y, the rake combiner 220y, the demodulator 230y and the deinterleaver 240y, so that the data are converted into quantized data 90 (see FIG. 34T) to be provided to the bit separator 250y.

The bit separator 250y separates (series/parallel converts) the data 90 into the systematic bit series data 91_1, the first parity bit series data 91_2 and the second parity bit series data 91_3 (see FIG. 34U; hereinafter, occasionally referred to as systematic bit 91_1, first parity bit 91_2 and second parity bit 91_3).

The second rate matching portion 260y provides, to the combiner 270y, systematic bit series data 92_1, the first parity bit series data 92_2 and the second parity bit series data 92_3 (see FIG. 34V; hereinafter, respectively referred to as systematic bit 92_1, first parity bit 92_2 and second parity bit 92_3, and occasionally represented by soft decision information 92) in which the rate matching is performed to the systematic bit 91_1, the first parity bit 91_2 and the second parity bit 91_3, respectively.

When the data are not retransmitted data, namely, when the buffer 350y is cleared at the time of the initial data transmission or by the buffer controller 340y, the combiner 270y provides the data 92_1-92_3 as they are to the first matching portion 280y, and provides the data 92_1-92_3 (see FIG. 34V; if e.g. quantized bit number is supposed to be 5 bits, the required memory capacity of the buffer 350y is M1=10040 bits) to the buffer 350y.

The first rate matching portion 280y provides, to the bit collector 290y, systematic bit series data 93_1, first parity bit series data 93_2 and second parity bit series data 93_3 (see FIG. 34W; hereinafter occasionally referred to as systematic bit 93_1, first parity bit 93_2 and second parity bit 93_3, respectively) in which the rate matching is performed to the combined data 92_1-92_3.

The bit collector 290y provides, to the error correcting decoder 320y, soft decision information 94 (see FIG. 34X) in which the bits of the data 93_1-93_3 are collected to be arranged. The error correcting decoder 320y performs turbo decoding processing (error correction processing) to the encoded data 94, outputs soft output data 95 (see FIG. 34Y;

not shown in FIG. 33), and performs hard decision processing to output hard decision result data 96 (see FIG. 34Z).

It is to be noted that the hard decision result data 96 are data resulting from error correction decoding, and the soft output data 95 are data composed of the hard decision result data 96 and reliability information of the hard decision result data 96.

The CRC detector 330y detects an error of the hard decision result data 96, and provides, to the buffer controller 340y, a decision signal 50y which is a decision result as to whether an error is present or absent. Also, when detecting the error of the hard decision result data 96, the CRC detector 330y requests the transmitting side error control apparatus 100y to retransmit the data. It is to be noted that FIG. 33 does not show a functional portion performing a retransmission request.

The buffer controller 340y clears the buffer 350y when the decision signal 50y indicates "OK", and holds the data of the combiner 270y when it indicates "NG".

Also, when the data 92_1-92_3 are retransmitted data, namely when the data are held in the buffer 350y, the combiner 270y outputs combined data 92_1-92_3 in which the data 92_1-92_3 and the data 92_1-92_3 held in the buffer 350y are combined. The combined data 92_1-92_3 are held in the buffer 350y.

As an error control method and device for reducing a retransmission data amount (the number of packets), there is "error control method and communication system using the method" conventionally known (see e.g. patent document 1).

In this error control method, a transmitter (transmitting side error control device) divides codewords obtained by performing error correction encoding to information into a plurality of packets to be transmitted. A receiver (receiving side error control device) measures reliability of each packet received, requests the transmitter to retransmit the packet when a predetermined condition based on the reliability is satisfied, combines a plurality of packets received including the retransmission packets, and decodes codewords thus obtained.

Namely, the receiving side error control device does not request to retransmit the entire codewords but requests to retransmit only a packet whose reliability is low within a plurality of packets composing the codewords. Thus, the amount of the data retransmitted is reduced.

(Patent document 1)

Japanese Patent Application Laid-open No. 2001-119426

However, since the error control apparatuses 200x and 200y shown in FIG. 29B and FIG. 33 hold soft decision information before the error correction decoding in the buffer 350y, the buffer 350y requires a capacity of "error correction code length"×"the number of quantized bits of soft decision information".

Namely, supposing that a transmission data length is "Ld", the encoding ratio of error correction encoding is "1/3", the number of quantized bits of the soft decision bits is "Nr" bits, a buffer of about 3×Ld×Nr bits is required, which makes the buffer memory amount large.

For example, the required memory capacity M0 of the buffer 350x shown in FIG. 29B is 5×1004×3=15060 (bits) as shown in FIG. 30U. Also, the required memory capacity M1 of the buffer 350y shown in FIG. 33 is 5×(1004+502+502)=10040 (bits) as shown in FIG. 34V.

Also, in the above-mentioned error control method for reducing the retransmission data amount, when a method by which the retransmitted data and the soft decision information before the error correction decoding are combined is adopted, the buffer memory capacity required assumes the same as that of the error control apparatus shown in FIGS. 29B and 33.

SUMMARY OF THE INVENTION

It is accordingly an object of the present invention to provide an error control apparatus on a receiving side using an HARQ which combines a forward error correction method (system) and an automatic repeat request method (system), wherein a memory capacity of a buffer is reduced.

FIG. 1 systematically shows principles (1)-(6) of an error control apparatus on a receiving side according to the present invention in order to achieve the above-mentioned object. The differences between the principles (1)-(5) are basically "what data are combined by a combiner", "what data are held by a buffer", "how the data held in the buffer are converted to be provided to the combiner", and "whether or not bits of data combined are restricted or limited (e.g. data are only systematic bits or the number of bits of data is restricted)" for combining "error detected data" and "retransmitted data".

The principle (6), different from the principles (1)-(5), shares a buffer for temporarily storing data in which an error has been detected with another memory, thereby reducing the memory capacity of the buffer.

The schematic operation of the principles (1)-(6) will now be described.

Principle (1)

Steps T100 and T110: At least information corresponding to a systematic bit is held in a buffer, and the buffer holds hard decision result data (corresponding to systematic bit) of an error correction decoding result in the principle (1).

Step T120: An encoder corresponding to an error correcting decoder, i.e. an error correcting encoder similar to that of a transmitting side error control apparatus re-encodes the hard decision result data held in the buffer.

Step T130: A combiner combines "retransmitted soft decision information" and "re-encoded data".

It is to be noted that the principle (1) can be applied to both of a systematic code and a non-systematic code.

Principle (2)

Steps T200 and T210: At least information corresponding to a systematic bit is held in the buffer in the same way as the principle (1), and the buffer holds soft output data from the error correcting decoder in the principle (2).

Step T220: A soft input soft output encoder re-encodes the soft output data into original soft decision information.

Step0 T230: The combiner combines the "retransmitted soft decision information" and "soft decision information re-encoded".

It is to be noted that the principle (2) can be applied to both of the systematic code and the non-systematic code.

Principle (3)

Steps T300 and T310: The information corresponding to the systematic bit is held in the buffer, and the buffer holds the soft output data of the error correction decoding result in the same way as the principle (2).

Step T320: The combiner combines "systematic bit of retransmitted soft decision information" and "soft output data (soft decision information)".

It is to be noted that the principle (3) can be applied only to the systematic code.

Principle (4)

Steps T400 and T410: The information corresponding to the systematic bit is held in the buffer, and the buffer holds the systematic bit of quantized soft decision information.

Step T420: The combiner combines the "systematic bit of retransmitted soft decision information" and "systematic bit of soft decision information held by the buffer".

It is to be noted that the principle (4) can be applied only to the systematic code.

Also, the buffer may further restrict the number of bits of the systematic bits to be stored.

Principle (5)

Step T500: The buffer holds the quantized soft decision information in which the bits are restricted.

Step T510: The combiner combines the "soft decision information retransmitted" and "soft decision information, held in the buffer, in which the bits are restricted".

It is to be noted that the principle (5) can be applied to both of the systematic code and the non-systematic code.

Principle (6)

Step T600: A reception data storing memory which a turbo decoder originally has is used as a buffer for an HARQ.

In order to achieve the above-mentioned object, an error control apparatus according to the present invention comprises: an error correcting decoder correcting an error of encoded data to be decoded into hard decision result data; a buffer storing the hard decision result data; a code error detector detecting whether or not an error is present in the hard decision result data, and requesting a retransmission of the encoded data in a presence of the error; a re-encoder encoding the hard decision result data into re-encoded data by an error correction encoding method same as that of the encoded data; and a combiner providing the error correcting decoder with encoded data in which the retransmitted encoded data and the re-encoded data are combined.

Namely, in the error control apparatus of the present invention, based on the above-mentioned principle (1), an error correcting decoder corrects an error of encoded data to be decoded into hard decision result data. The hard decision result data are stored in a buffer. A code error detector detects whether or not an error is present in the hard decision result data, and requests a transmitting side error control apparatus to retransmit the encoded data in the presence of the error.

A re-encoder encodes the hard decision result data into re-encoded data by an error correction encoding method the same as that of the encoded data. A combiner provides, to the error correcting decoder, encoded data in which the retransmitted encoded data and the re-encoded data are combined.

Thus, the buffer has only to store the hard decision result data (see e.g. hard decision result data 74 in FIG. 30X), and the memory capacity of the buffer can be greatly reduced since soft decision information (see e.g. required memory capacity M0 of FIG. 30U) is not required to be stored in the buffer, different from the prior art error control apparatus.

Also, in order to achieve the above-mentioned object, an error control apparatus according to the present invention comprises: an error correcting decoder correcting an error of encoded data to be decoded into soft output data and hard decision result data; a buffer storing the soft output data; a code error detector detecting whether or not an error is present in the hard decision result data, and requesting a retransmission of the encoded data in a presence of the error; a soft input soft output encoder encoding the soft output data into re-encoded data having soft information (hereinafter, occasionally referred to as re-soft-encoded data) by an encoding method corresponding to a decoding method of the error correcting decoder; and a combiner providing the error correcting decoder with encoded data in which the retransmitted encoded data and the re-soft-encoded data are combined.

Namely, the error control apparatus of the present invention is composed based on the above-mentioned principle (2). An error correcting decoder corrects an error of encoded data received to be decoded into soft output data (e.g. see soft output data 73 of FIG. 30W) and hard decision result data. The soft output data are stored in a buffer. A code error detector detects whether or not an error is present in the hard decision result data, and request a transmitting side error control apparatus to retransmit the encoded data.

A soft input soft output encoder encodes the soft output data into re-soft-encoded data by an encoding method corresponding to a decoding method of the error correcting decoder. A combiner provides, to the error correcting decoder, encoded data in which the retransmitted encoded data and the re-soft-encoded data are combined.

Thus, the buffer has only to store the soft output data, and the required memory capacity of the buffer can be greatly reduced since soft decision information (see memory capacity M0 required for the prior art example of FIG. 30U) is not required to be stored in the buffer, different from the prior art error control apparatus.

Also, in order to achieve the above-mentioned object, an error control apparatus according to the present invention comprises: a bit separator separating first encoded data into a first systematic bit and a parity bit; a code error detector detecting whether or not an error is present in hard decision result data, and requesting a retransmission of the first encoded data in a presence of the error; a systematic bit combiner combining the first systematic bit of the first encoded data retransmitted and soft output data to obtain a second systematic bit; a bit collector multiplexing the second systematic bit and the parity bit into second encoded data; an error correcting decoder correcting an error of the second encoded data to be decoded into the soft output data and the hard decision result data; and a buffer storing the soft output data.

Namely, the error control apparatus of the present invention is composed based on the above-mentioned principle (3). A bit separator separates first encoded data (soft decision information) into a first systematic bit and a parity bit. A code error detector detects whether or not an error is present in hard decision result data and requests a retransmission of the first encoded data in the presence of the error.

An error correcting decoder corrects an error of the second encoded data (soft decision information) to be decoded into the soft output data and the above-mentioned hard decision result data. The soft output data are stored in a buffer.

A systematic bit combiner combines the first systematic bit included in the first encoded data retransmitted in the presence of the error in the hard decision result data and soft output data described later to output a second systematic bit. A bit collector multiplexes the soft output data and the parity bit to output second encoded data.

Thus, the buffer has only to store the soft output data (see e.g. FIG. 34Y), and the required memory capacity of the buffer can be reduced since soft decision information (see e.g. required memory capacity M1 of FIG. 34V) is not required to be stored in the buffer, different from the prior art error control apparatus.

Also, in order to achieve the above-mentioned object, an error control apparatus according to the present invention comprises: a bit separator separating first encoded data into a first systematic bit and a parity bit; a bit restricting portion outputting a second systematic bit in which a number of the first systematic bits is restricted; a buffer storing the second systematic bit; a code error detector detecting whether or not an error is present in the hard decision result data, and requesting a retransmission of the first encoded data in a presence of the error; a systematic bit combiner combining the first systematic bit of the first encoded data retransmitted and the second systematic bit to obtain a third systematic bit; a bit collector multiplexing the third systematic bit and the parity bit into second encoded data; and an error correcting decoder correcting an error of the second encoded data to be decoded into the hard decision result data.

Namely, the error control apparatus of the present invention is composed based on the above-mentioned principle (4). A bit separator separates first encoded data (soft decision information) into a first systematic bit and a parity bit. A bit restricting portion provides, to a buffer, a second systematic bit in which the number of first systematic bits is restricted, and the buffer stores the second systematic bit.

A code error detector detects whether or not an error is present in the hard decision result data and requests a retransmission of the first encoded data in the presence of the error.

A systematic bit combiner combines the first systematic bit of the first encoded data retransmitted and the second systematic bit to obtain a third systematic bit. A bit collector multiplexes the third systematic bit and the parity bit into second encoded data (soft decision information). An error correcting detector corrects an error of the second encoded data to be decoded into the hard decision result data.

Thus, the buffer has only to store the systematic bit in which the number of bits is restricted (the number of bits among e.g. the systematic bit 71_1 of FIG. 30U is restricted), and the required memory capacity of the buffer can be reduced since soft decision information (see e.g. required memory capacity M0 of FIG. 30U) is not required to be stored in the buffer, different from the prior art error control apparatus.

It is to be noted that bit restriction includes a case where a bit is not restricted and all of the systematic bits are used. Also in this case, the capacity of the buffer is reduced.

Also, in order to achieve the above-mentioned object, an error control apparatus according to the present invention comprises: a bit restricting portion outputting second encoded data in which a number of bits of first encoded data is restricted; a buffer storing the second encoded data; a code error detector detecting whether or not an error is present in the hard decision result data, and requesting a retransmission of the first encoded data in a presence of the error; a combiner combining the first encoded data retransmitted and the second encoded data to obtain third encoded data; and an error correcting decoder correcting an error of the third encoded data to be decoded into the hard decision result data.

Namely, the error control apparatus of the present invention is composed based on the above-mentioned principle (5). A bit restricting portion provides, to a buffer, second encoded data (soft decision information) which are the first encoded data (soft decision information) in which the number of bits is restricted. The buffer stores the second encoded data.

A code error detector detects whether or not an error is present in the hard decision result data and requests a retransmission of the first encoded data in the presence of the error. A combiner combines the first encoded data retransmitted and the second encoded data stored in the buffer to obtain third encoded data (soft decision information). An error correcting decoder corrects an error of the third encoded data to be decoded into the hard decision result data.

Thus, the buffer has only to store the encoded data in which the number of bits is restricted (the number of bits is restricted in FIG. 30U). Accordingly, the required memory capacity of the buffer can be reduced compared with the memory capacity (see required memory capacity M0 of FIG. 30U) required for storing all of the encoded data in the prior art error control apparatus.

Furthermore, in order to achieve the above-mentioned object, an error control apparatus according to the present invention comprises: an error correcting decoder having a memory storing first encoded data received and correcting an error of the first encoded data to output hard decision result data decoded; a code error detector detecting whether or not an error is present in the hard decision result data, and requesting a retransmission of second encoded data in a presence of the error; and a combiner providing the memory with third encoded data in which the second encoded data retransmitted and the first encoded data stored in the memory are combined.

Namely, the error control apparatus of the present invention is composed based on the above-mentioned principle (6). An error correcting decoder e.g. a turbo decoder is provided with a memory storing first encoded data (soft decision information) received. The error correcting decoder corrects an error of the first encoded data stored in the memory to output hard decision result data decoded. A code error detector detects whether or not an error is present in hard decision result data, and requests a retransmission of the encoded data in the presence of the error.

A combiner combines the second encoded data retransmitted and the first encoded data stored in the memory, and the memory stores combined third encoded data. An error correcting decoder corrects an error of the third encoded data stored in the memory to output hard decision result data decoded.

Thus, a reception data storing memory which the error correcting decoder, e.g. a turbo decoder originally has can be used as a buffer for an HARQ, thereby enabling the capacity of the buffer to be reduced.

Also, in the above-mentioned present invention, the error correcting decoder and the re-encoder respectively may comprise a turbo decoder and a turbo encoder.

Also, in the above-mentioned present invention, the soft input soft output encoder may be provided with an error correcting encoder performing, to a sign, a calculation equivalent to that of an error correcting encoder on a transmitting side corresponding to the error correcting decoder by using a sign/absolute value separating circuit which separates the soft output data into the sign and an absolute value thereof, and a multiplier outputting the soft encoded data by multiplying an encoded result of the error correcting encoder by the absolute value.

Also, in the above-mentioned present invention, the soft input soft output encoder may have an error correcting encoder performing, to a sign and an absolute value addition result, a calculation equivalent to that of an error correcting encoder on a transmitting side corresponding to the error correcting decoder by using a sign multiplier/absolute value adder which performs a multiplication of the sign of the soft output data and an addition of the absolute value.

Also, in the above-mentioned present invention, the soft input soft output encoder may have an error correcting encoder performing, to a multiplication result, a calculation equivalent to that of an error correcting encoder on a transmitting side corresponding to the error correcting decoder by using a multiplier which performs a multiplication of the soft output data.

Also, the above-mentioned present invention may further comprise a first weighting potion weighting the encoded data retransmitted to be provided to the combiner, and a second weighting portion weighting the re-encoded data to be provided to the combiner.

Also, the above-mentioned present invention may further comprise a first weighting potion weighting the encoded data retransmitted to be provided to the combiner, and a second weighting portion weighting the re-soft-encoded data to be provided to the combiner.

Also, the above-mentioned present invention may further comprise a first weighting potion weighting the first systematic bit of the first encoded data retransmitted to be provided to the combiner, and a second weighting portion weighting the soft output data to be provided to the combiner.

Also, the above-mentioned present invention may further comprise a first weighting potion weighting the first systematic bit of the first encoded data retransmitted to be provided to the combiner, and a second weighting portion weighting the second systematic bit to be provided to the combiner.

Furthermore, the above-mentioned present invention may further comprise a first weighting potion weighting the first encoded data retransmitted to be provided to the combiner, and a second weighting portion weighting the second encode data to be provided to the combiner.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which:

FIGS. 29A and 29B are block diagrams showing an arrangement (1) of general error control apparatuses on a transmitting side and a receiving side;

FIGS. 30J-30L and 30T-30X are diagrams showing data examples of general error control apparatuses on a transmitting side and a receiving side;

FIGS. 34T-34Z are diagrams showing data examples of a general error control apparatus on a receiving side.

DESCRIPTION OF THE EMBODIMENTS

Embodiment (1)

Figure 1:
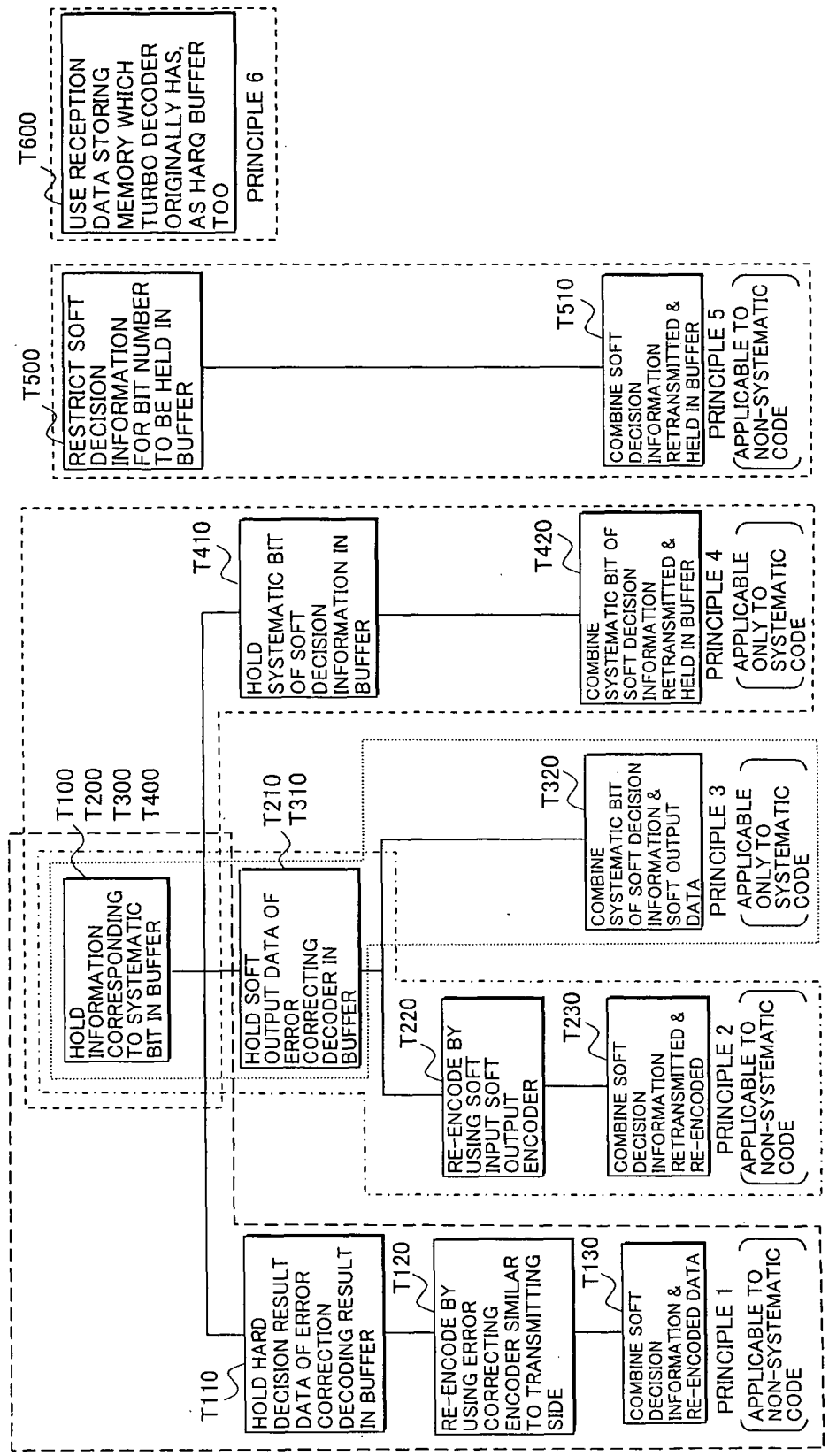
FIG. 1 is a diagram showing principles (1)-(6) of an error control apparatus according to the present invention.
Figure 2:
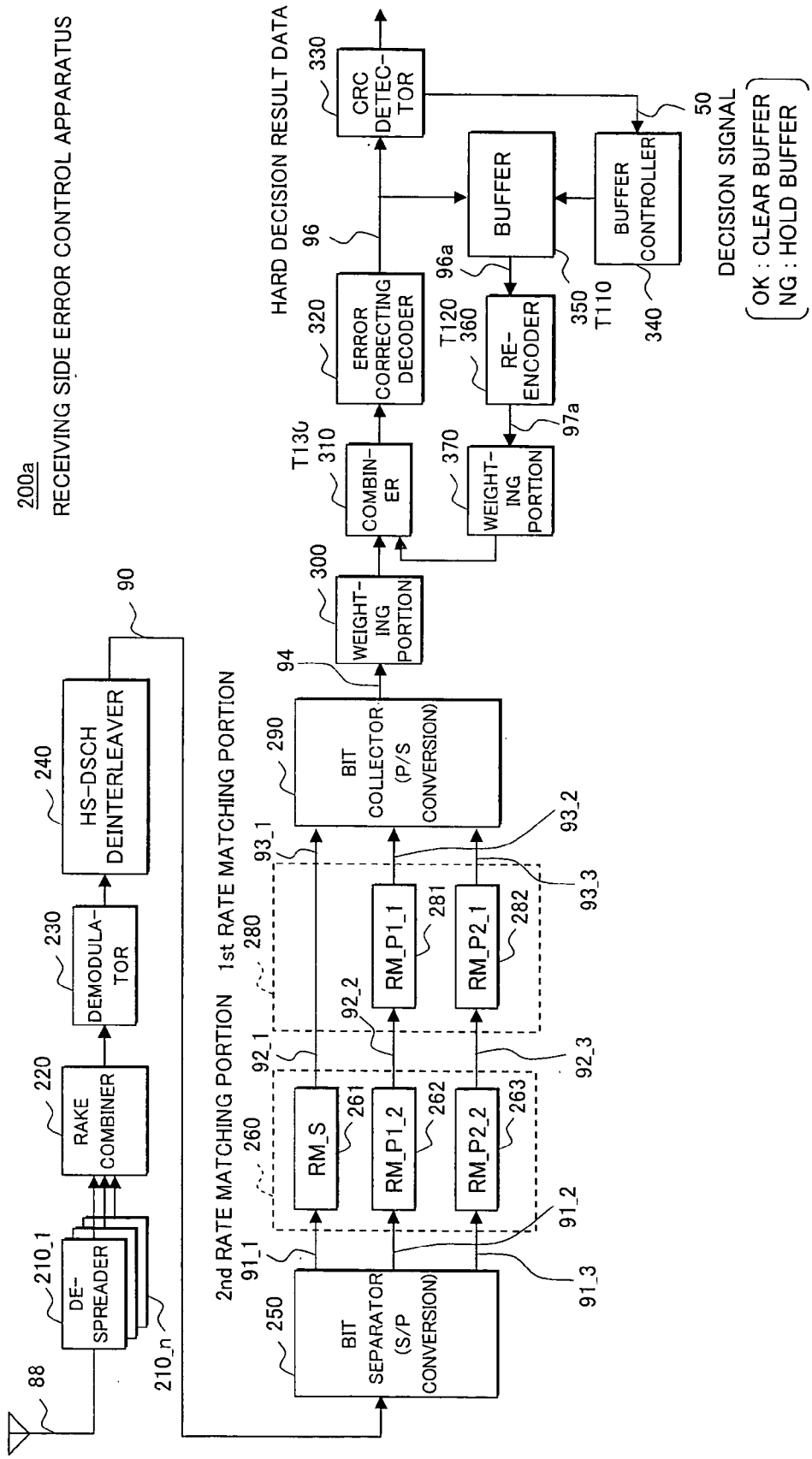
FIG. 2 is a block diagram showing an embodiment (1) of an error control apparatus according to the present invention.

FIG. 2 shows an embodiment (1) of an error control apparatus 200a according to the present invention. This embodiment (1) indicates a case where the error control apparatus is applied to a receiving system corresponding to a transmitting system prescribed by the 3GPP. The arrangement of the error control apparatus 200a ranging from de-spreaders 210_1-210_n (hereinafter, occasionally represented by a reference numeral 210) to a second rate matching portion 260 is the same as that of the prior art error control apparatus 200y shown in FIG. 33.

The error control apparatus 200a is different from the prior art error control apparatus 200y in that a combiner 310 is connected between a bit collector 290 and an error correcting decoder 320 through a weighting portion 300 instead of being connected between the second rate matching portion 260 and a first rate matching portion 280, and the second rate matching portion 260 and the first rate matching portion 280 are connected directly.

Also, different from the prior art error control apparatus 200y, a buffer 350 is connected to the error correcting decoder 320 instead of being directly connected to the combiner 310, and inputs hard decision result data 96.

Furthermore, different from the prior art error control apparatus 200y, a re-encoder 360 which encodes hard decision result data 96a stored in the buffer 350 corresponding to the error correcting decoder 320 is connected to an output side of the buffer 350, and output signal re-encoded data 97a of the re-encoder 360 are provided to the combiner 310 through a weighting portion 370.

It is to be noted that the re-encoder 360 may use the same encoder as that used in the transmitting side error control apparatus.

FIGS. 3T-3Z show data examples in a case where a turbo code is used in the embodiment (1), which are similar to the data examples shown in FIGS. 34T-34Z in the prior art error control apparatus 200y. However, FIGS. 3T-3Z show the buffer 350, the re-encoder 360, the weighting portions 370 and 300, and combiner 310 of FIG. 2 in relation to the data. The operation of the embodiment (1) will now be described referring to FIGS. 3T-3Z.

Figure 33:
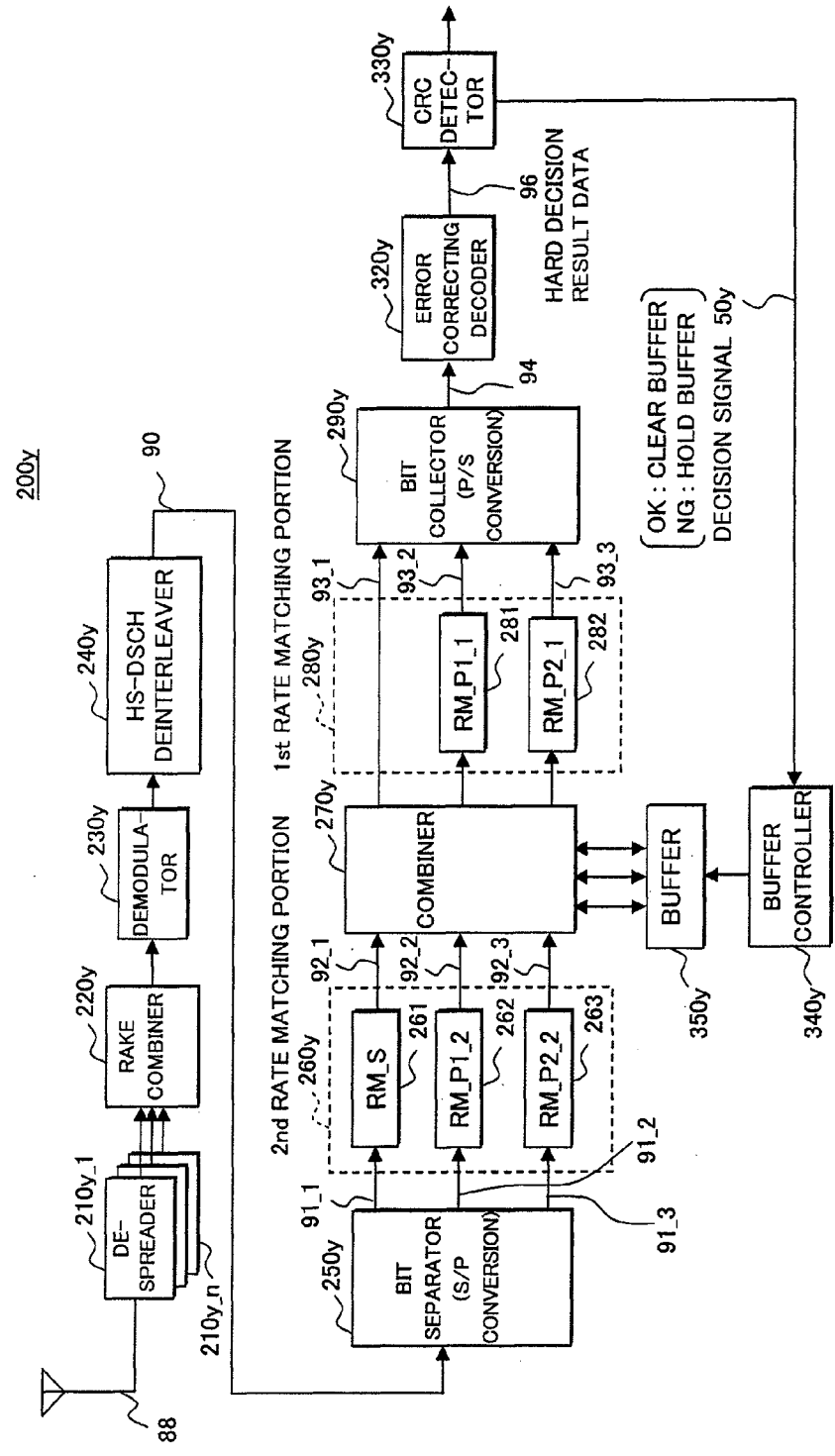
FIG. 33 is a block diagram showing an arrangement (2) of a general error control apparatus on a receiving side.

The operation from the de-spreader 210 to the second rate matching portion 260 is the same as that of the prior art receiving side error control apparatus 200y shown in FIG. 33. Output data 92_1-92_3 of the second rate matching portion 260 are provided to the bit collector 290 through the first rate matching portion 280.

The bit collector 290 provides the soft decision information 94 (see FIG. 3X) in which data 93_1-93_3 are collected to the weighting portion 300, which provides the data which are the soft decision information 94 as weighted to the combiner 310.

When the received soft decision information 94 is the first data, or data for which an error has not been detected in the previous reception, the buffer 350 has been cleared. Since there is no data input through the weighting portion 370, the combiner 310 provides the soft decision information 94 as it is to the error correcting decoder 320.

When an error has been detected in the previous reception, namely when the buffer 350 holds hard decision result data 96a, the combiner 310 provides data in which the soft decision information 94 and re-encoded data 97a respectively weighted and retransmitted are combined to the error correcting decoder 320.

It is to be noted that weightings in the weighting portions 300 and 370 are performed to the soft decision information 94 and the re-encoded data 97a retransmitted based on their S/N or the like.

Figure 3:
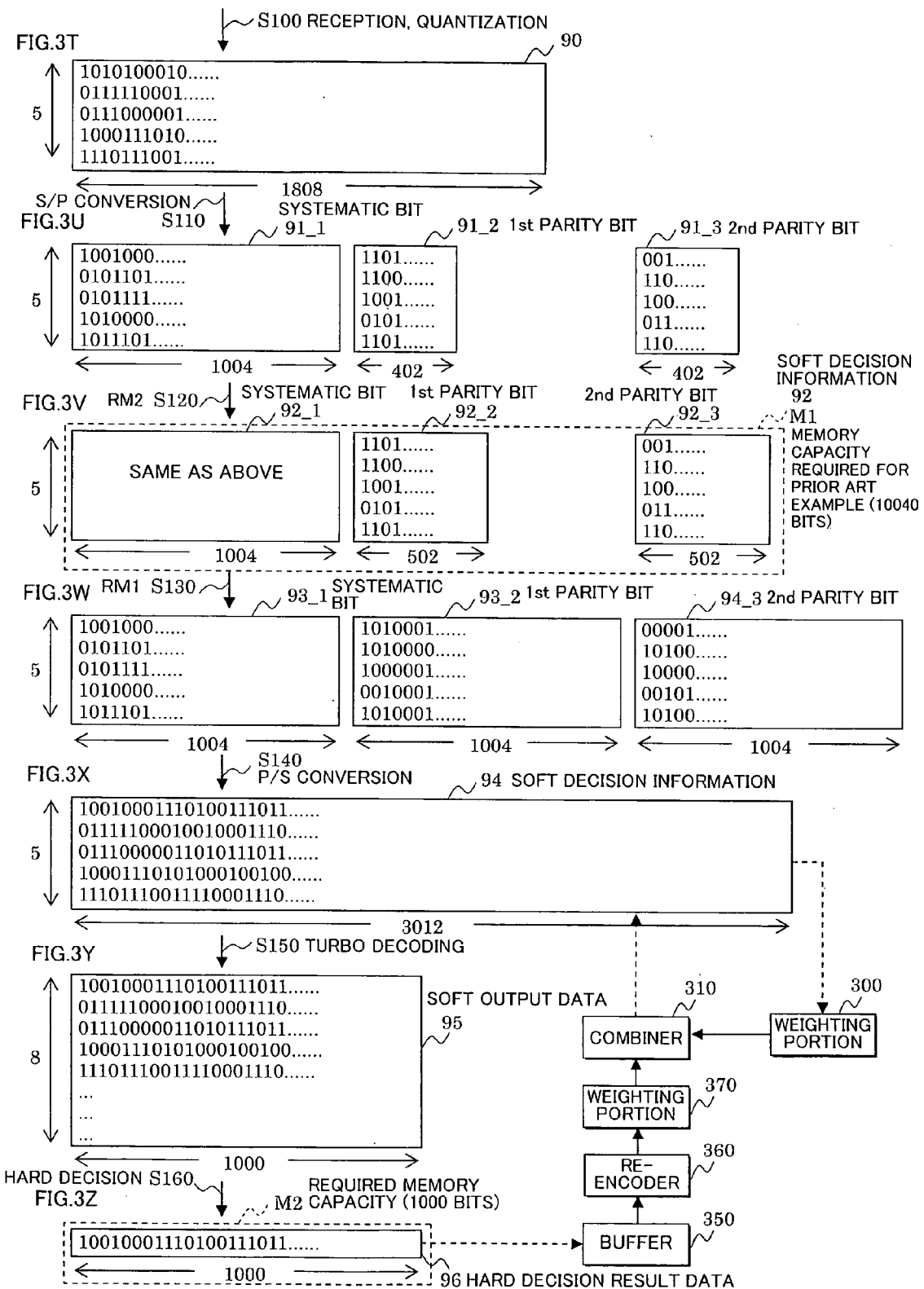
FIGS. 3T-3Z are diagrams showing data examples in an embodiment (1) of an error control apparatus according to the present invention.

The error correcting decoder 320 decodes the data from the combiner 310, and outputs soft output data 95 (see FIG. 3Y; not shown in FIG. 2) and hard decision result data 96 (see FIG. 3Z).

Figure 31:
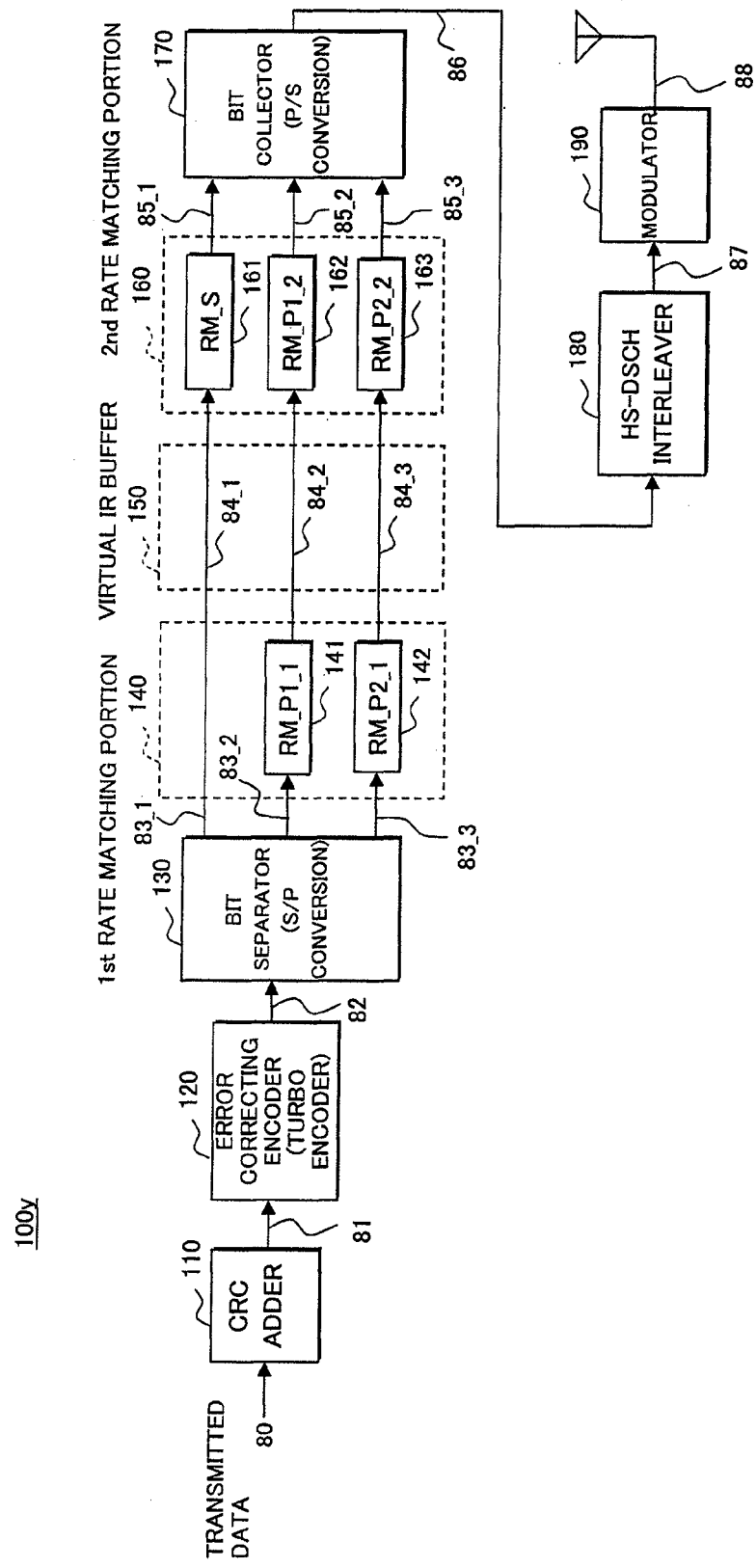
FIG. 31 is a block diagram showing an arrangement (2) of a general error control apparatus on a transmitting side.
Figure 32:
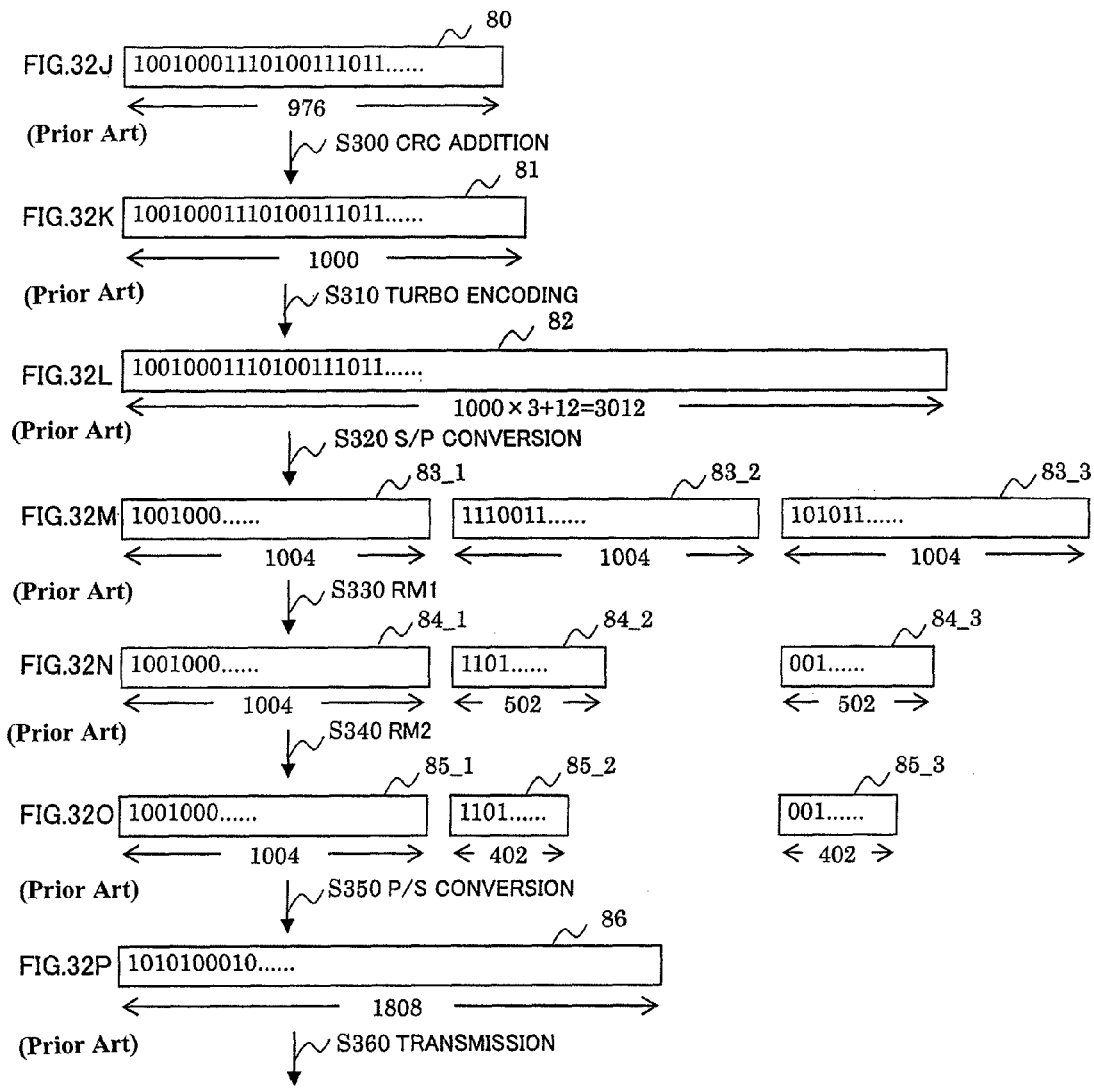
FIGS. 32J-32P are diagrams showing data examples of a general error control apparatus on a transmitting side.

The CRC detector 330 determines whether or not an error is present in the hard decision result data 96, and requests the transmitting side error control apparatus 100y (see FIG. 31) to retransmit the data by transmitting a data repeat request (not shown).

Also, the CRC detector 330 provides a decision signal 50 indicating a decision result to a buffer controller 340. When the decision signal 50 indicates "OK (error is absent)", the buffer controller 340 clears the buffer 350, and when it indicates "NG (error is present)", the hard decision result data 96 are held in the buffer 350.

Thus, the required memory capacity M2 of the buffer 350 assumes 1000 bits (see FIG. 3Z), and if it is compared with the prior art required memory capacity M1=10040 bits (see FIG. 3V; indicating a numerical example in a case where the capacity of virtual IR buffer corresponds to an encoding ratio 1/2), the capacity M2 assumes $1000/10040 \approx 1/10$. Namely, the memory amount required for the buffer assumes Ld bits, which is about 1/(2×Nr) times as much as the capacity in the prior art example. In this case the Ld indicates a transmission data length, and the Nr indicates the number of quantized bits of soft decision information.

It is to be noted that not only a systematic code such as a turbo code but also non-systematic code can be applied in the embodiment (1).

Figure 4:
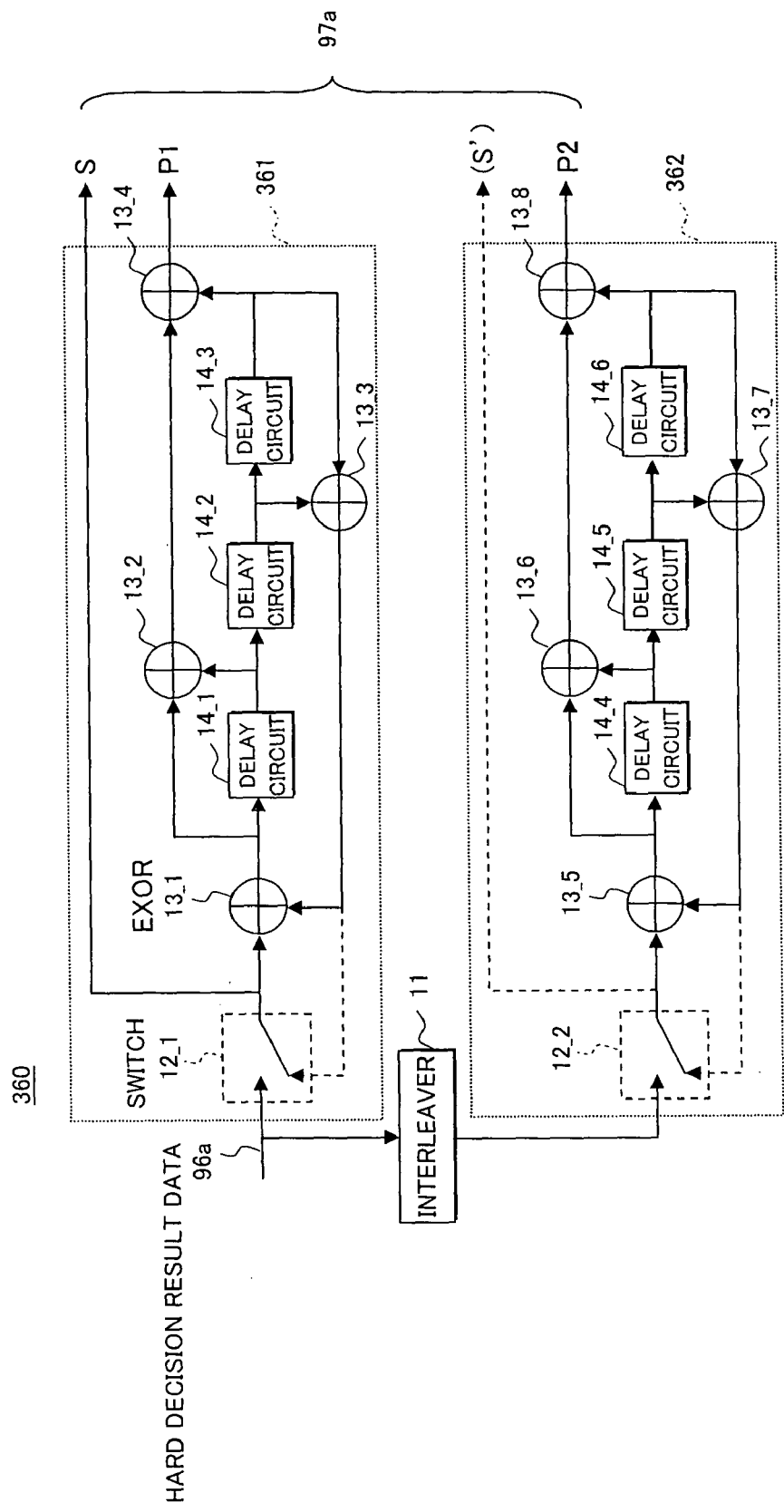
FIG. 4 is a block diagram showing an embodiment of a re-encoder (turbo encoder) in an error control apparatus according to the present invention.

FIG. 4 shows an arrangement of the re-encoder 360 shown in FIG. 2. This re-encoder 360 specifically indicates a case where the turbo code is used as the error correcting code, and the re-encoder 360 is the same as the turbo encoder 120 on the transmitting side shown in FIG. 31.

The re-encoder 360 inputs the hard decision result data 96a stored in the buffer 350, and outputs systematic bit series data S, first parity bit series data P1 and second parity bit series data P2.

The re-encoder 360 is composed of a first encoder 361 which inputs the hard decision result data 96a to output the systematic bit series data S and the first parity bit series data P1, an interleaver 11 which interleaves the hard decision result data 96a, and a second encoder 362 which inputs the hard decision result data 96a interleaved to output systematic bit series data (data except tail part are not actually used) S' and second parity bit series data P2.

The encoder 361 is composed of a switch 12_1, an EXOR calculator 13_1, delay circuits 14_1-14_3, an EXOR calculator 13_2 inputting output signals of the EXOR calculator 13_1 and the delay circuit 14_1, an EXOR calculator 13_4 inputting output signals of the EXOR calculator 13_2 and delay circuit 14_3 to output the first parity bit series data P1 and an EXOR calculator 13_3 inputting output signals of the delay circuits 14_2 and 14_3 to provide the calculation result to an input terminal of the EXOR calculator 13_1 or the switch 12_1, connected in series. It is to be noted that the output signal of the switch 12_1 is systematic bit series data S or a tail bit.

The arrangements of the first encoder 361 and the second encoder 362 are the same.

Embodiment (2)

Figure 5:
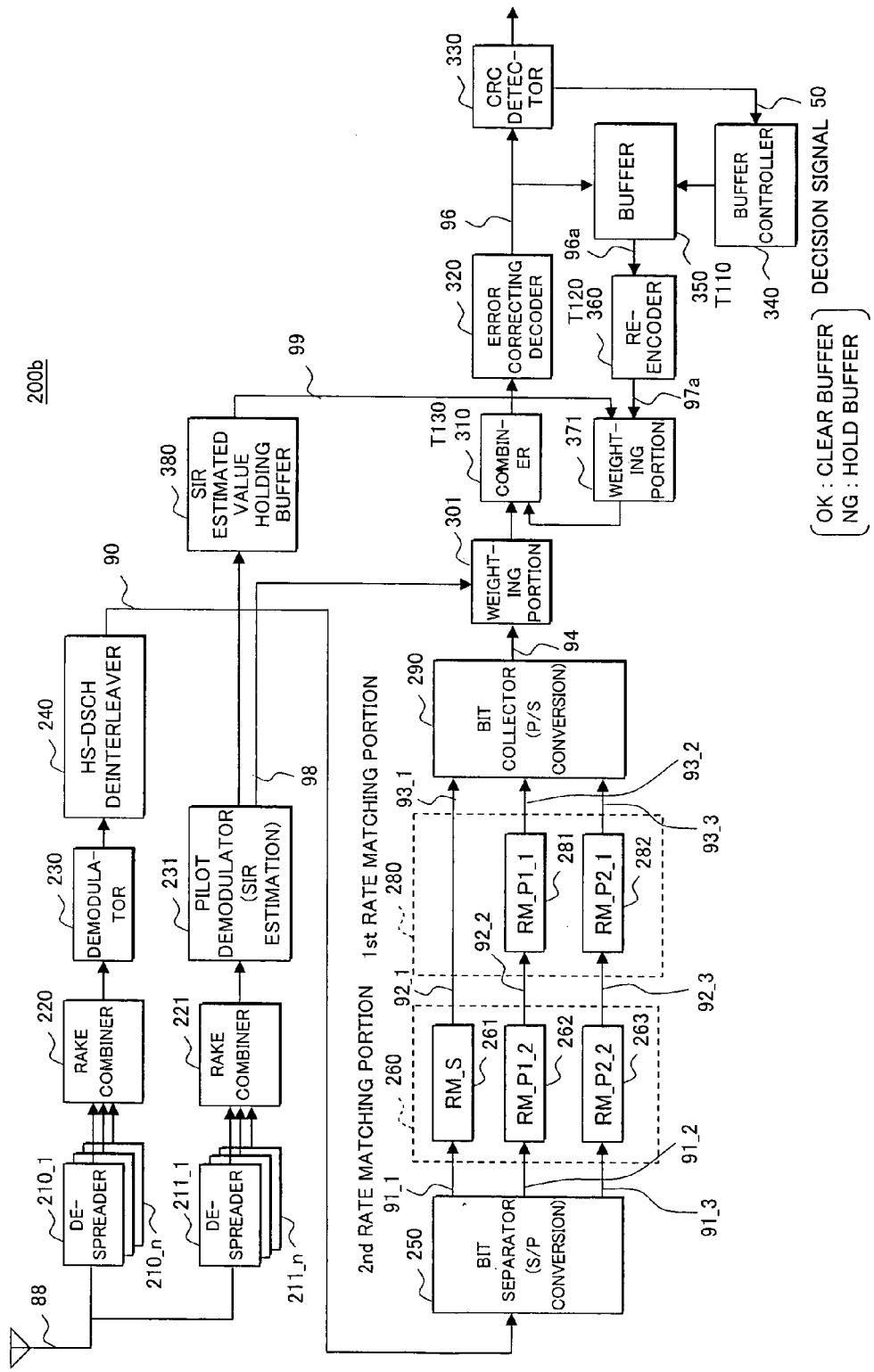
FIG. 5 is a block diagram showing an embodiment (2) of an error control apparatus according to the present invention.

FIG. 5 shows an embodiment (2) of an error control apparatus 200b of the present invention. In this error control apparatus 200b, an SIR (Signal to Interference Ratio) estimation functional portion is added to the error control apparatus 200a of the embodiment (1) shown in FIG. 2.

Namely, in the error control apparatus 200b, de-spreaders 211, a rake combiner 221, a pilot demodulator (SIR estimation) 231 and an SIR estimated value holding buffer 380 respectively similar to the de-spreader 210, the rake combiner 220 and the demodulator 230 are added to the error control apparatus 200a.

The de-spreader 211, the rake combiner 221, the pilot demodulator (SIR estimation) 231 and the SIR estimated value holding buffer 380 are the SIR estimation functional portions, perform an SIR estimation of the pilot signal of data 88 and designate weighting to weighting portions 301 and 371.

Namely, respective weighting is performed according to the SIR (S/N) of the reception data 88, when the soft decision information 94 retransmitted and the re-encoded data 97a of the hard decision result data 96a held by the buffer 350 are combined.

The de-spreader 211, the rake combiner 221, and the pilot demodulator 231 demodulate the pilot signal of the reception data 88. The pilot demodulator 231 estimates a signal component and a noise component included in the pilot signal, and estimates the SIR by calculating its ratio. The SIR estimated value holding buffer 380 stores a past SIR estimated result in order to use it upon combining.

The pilot demodulator 231 and the SIR estimated value holding buffer 380 respectively provide weighting designation signals 98 and 99 designating weighting to the weighting portions 301 and 371 based on the SIR estimated result.

In the embodiment (2), the required capacity of the buffer 350 is about 1/10 of the prior art required capacity in the same way as the embodiment (1).

Embodiment (3)

Figure 6:
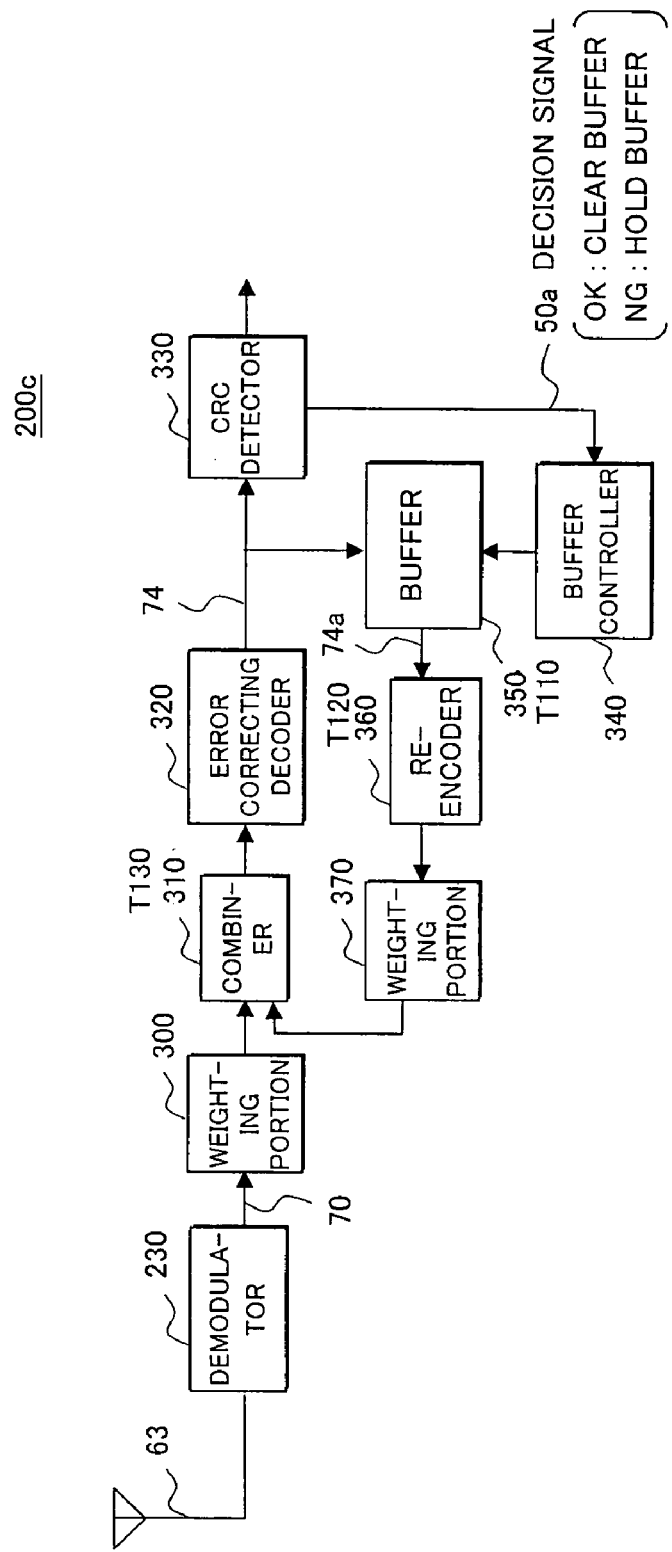
FIG. 6 is a block diagram showing an embodiment (3) of an error control apparatus according to the present invention.

FIG. 6 shows an embodiment (3) of the error control apparatus according to the present invention. In this embodiment (3), deinterleaving and rate matching in the embodiment (1) shown in FIG. 2 are not performed, and an example performing a general demodulation is shown.

Accordingly, in the embodiment (3), the de-spreader 210, the rake combiner 220, the deinterleaver 240, the bit separator 250, the second rate matching portion 260, the first rate matching portion 280 and the bit collector 290 in the embodiment (1) shown in FIG. 2 are not included, so that the demodulator 230 and the weighting portion 300 are connected directly. Also, the operation of the embodiment (3) is the same as that of the embodiment (1) except that a demodulation method is different and the deinterleaving and rate matching are not performed.

It is to be noted that a transmitting side error control apparatus corresponding to the embodiment (3) is the error control apparatus 100x shown in FIG. 29A.

FIGS. 7T-7X show data examples in the embodiment (3), which specifically indicates a case where the turbo code is used as the error correcting code. Also, FIGS. 7T-7X show data 71_1-71_3 to which an S/P conversion is performed in order to be compared with the prior art required memory capacity M0.

Also, FIGS. 7T-7X show the buffer 350, the re-encoder 360, the weighting portion 370, the combiner 310 and the weighting portion 300 shown in FIG. 6 in order to facilitate understanding the relationship between the required memory capacity M2 of the buffer 350 and the prior art required memory capacity M0.

Figure 7:
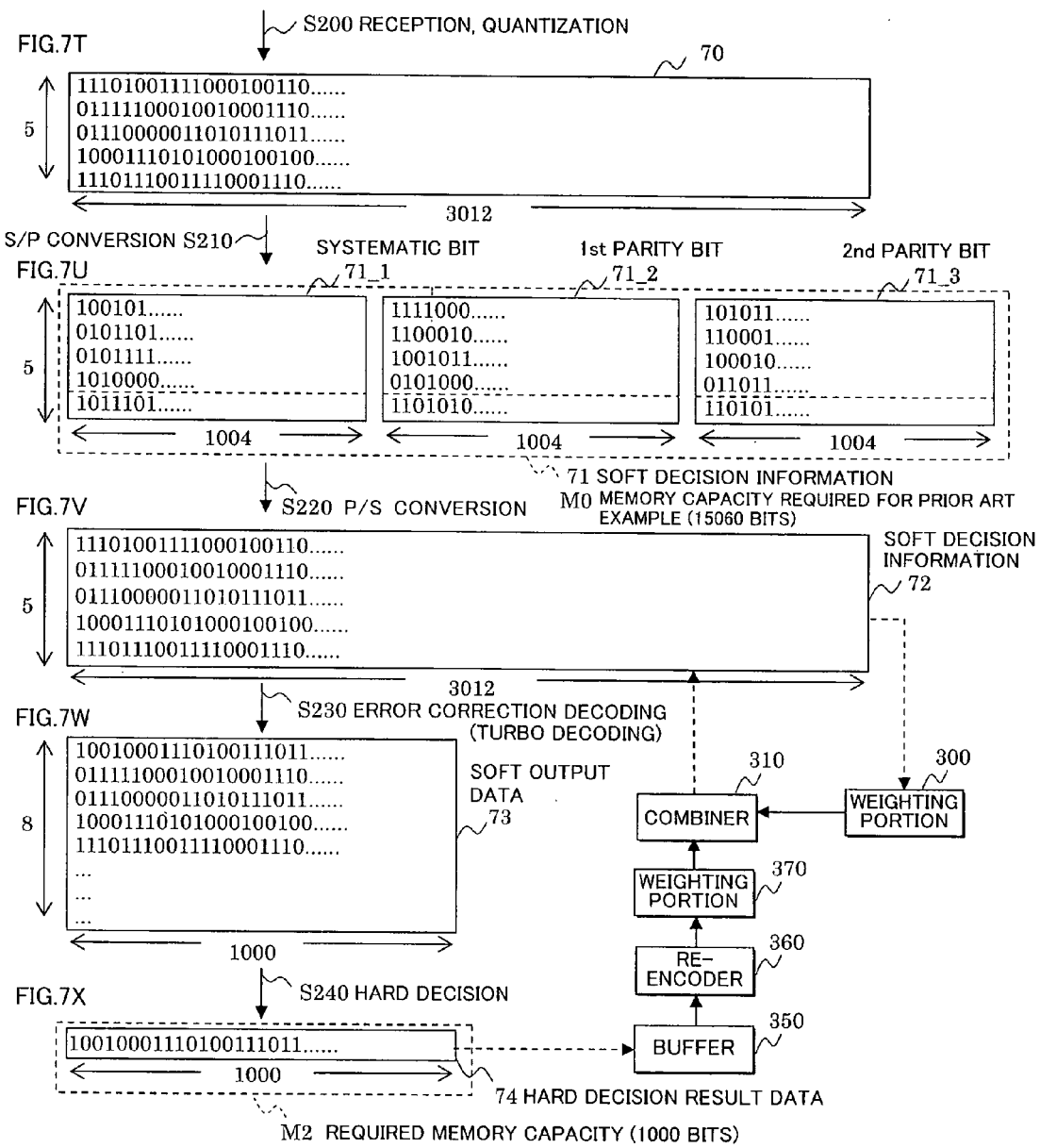
FIGS. 7T-7X are diagrams showing data examples in an embodiment (3) of an error control apparatus according to the present invention.
FIGS. 9T-7Z are diagrams showing data examples in an embodiment (4) of an error control apparatus according to the present invention.

The buffer 350 stores the hard decision result data of FIG. 7X. Accordingly, the required memory capacity M2 (=1000 bits) of the buffer 350 in the embodiment (3) is about 1/15 of the prior art required memory capacity M0 (=15060 bits).

Namely, the memory capacity M2 required for the buffer assumes Ld bits, which is about $1/(3 \times Nr)$ times of the prior art example. The Ld indicates the transmission data length, and the Nr indicates the number of quantized bits of soft decision information in this case.

Embodiment (4)

Figure 8:
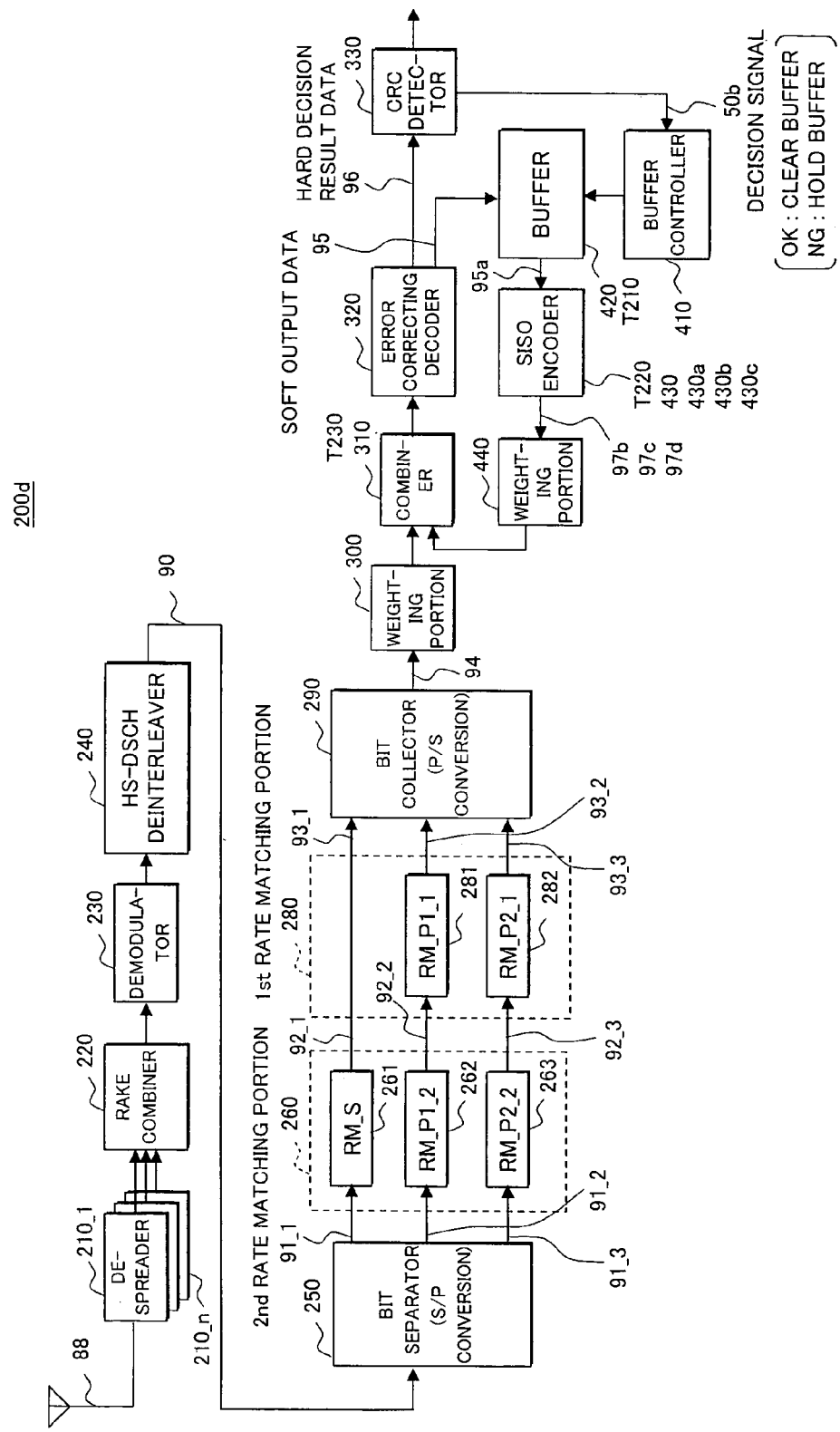
FIG. 8 is a block diagram showing an embodiment (4) of an error control apparatus according to the present invention.
Figure 9:
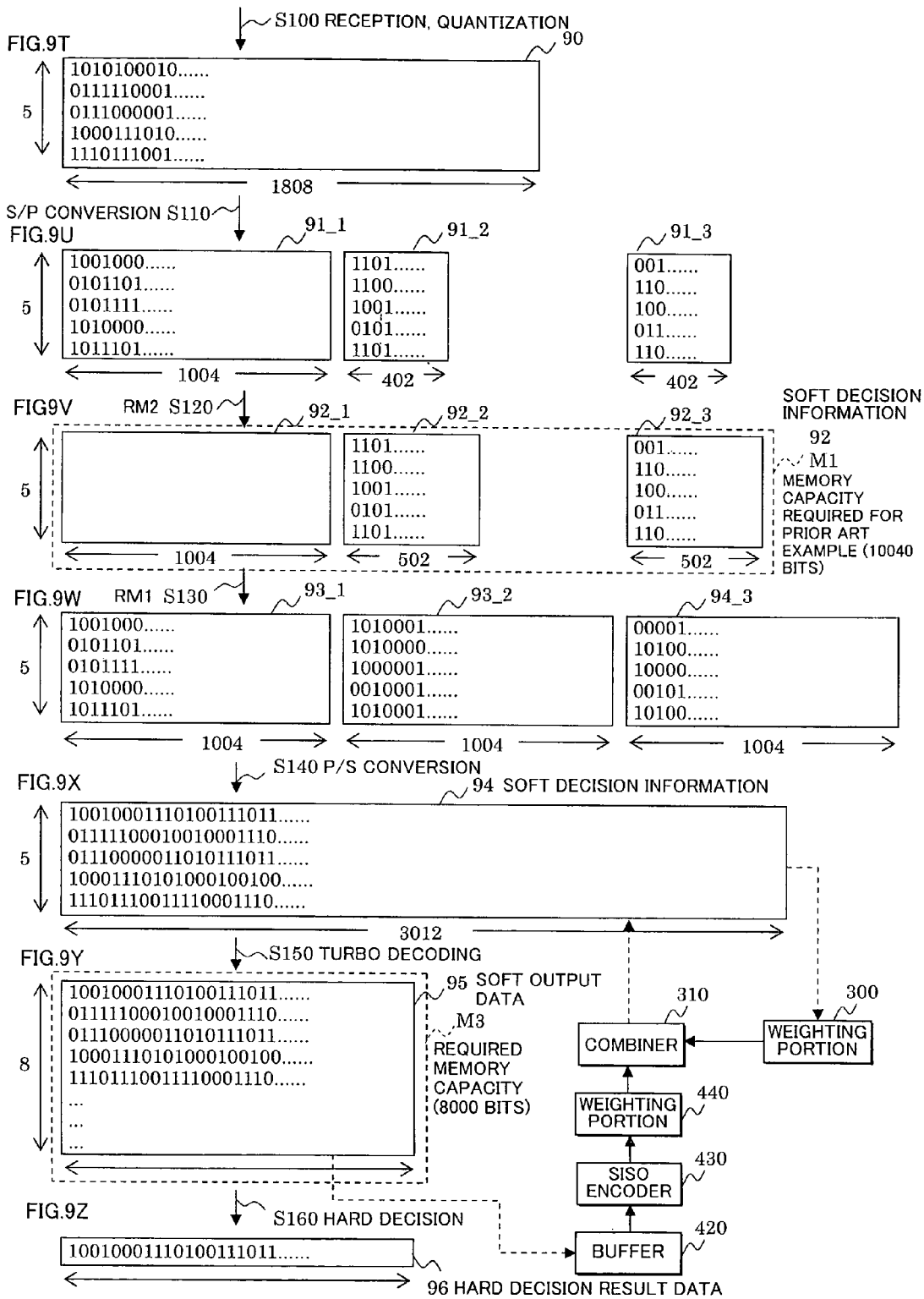

FIG. 8 shows an embodiment (4) of an error control apparatus 200d of the present invention. This embodiment (4) is different from the embodiment (1) shown in FIG. 2 in that a buffer 420 stores soft output data 95 instead of the hard decision result data 96.

The arrangement of the embodiment (4) is the same as that of the embodiment (1) except that the buffer 420 stores the soft output data 95 from the error correcting decoder 320, the stored soft output data 95a are provided to a Soft Input Soft Output (SISO) encoder 430, and re-encoded data 97b of the SISO encoder 430 are provided to a weighting portion 440.

FIGS. 9T-9Z show data examples in the embodiment (4). The data examples are those of the turbo code in the same way as the embodiment (1) shown in FIGS. 3T-3Z. However, different from the embodiment (1), the data stored by the buffer 420 are not the hard decision result data 96 of FIG. 9Z but the soft output data 95 of FIG. 9Y.

If the number of quantized bits of the soft output data 95 held by the buffer 420 is supposed to be M, the required memory capacity M3 of the buffer 420 assumes Ld×M bits, which is about $M/(3 \times Nr)$ times of the prior art required memory capacity. It is to be noted that "Ld" is a transmission data length and "Nr" is the number of quantized bits of the soft decision information.

Accordingly, the required memory capacity M3=8000 (8×1000) bits (in case of M=8) of the buffer 420 in the embodiment (4), which is $8000/10040 \approx 8/10$ of the prior art required memory capacity M1.

It is to be noted that the embodiment (4) can be applied not only to the systematic code such as a turbo code but also to a non-systematic code.

Figure 10:
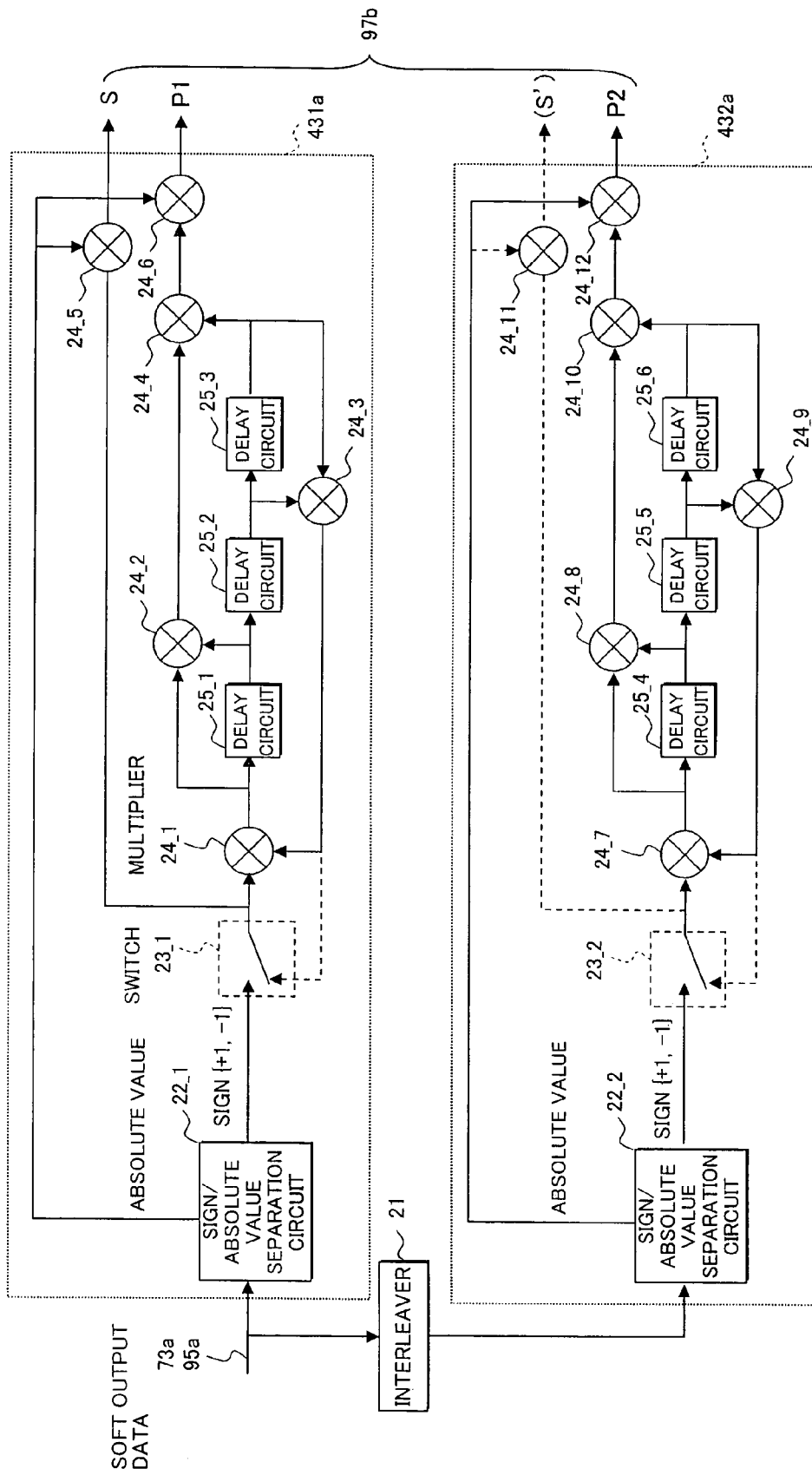
FIG. 10 is an arrangement (1) of an SISO turbo encoder in an error control apparatus according to the present invention.

FIG. 10 shows an embodiment (1) of an SISO encoder 430a shown in FIG. 8. This SISO encoder 430a is composed to multiply the soft output data by an encoded result of the prior art turbo encoder.

The SISO encoder 430a is composed of an encoder 431a which inputs the soft output data 95a as soft input data to output the systematic bit series data S and the first parity bit series data P1, an interleaver 21 which interleaves the soft input data, and an encoder 432a which inputs the output signal of the interleaver 21 to output systematic bit series data S' (data except the tail part are not used in this embodiment (4)) and the second parity bit series data P2.

Namely, the SISO encoder 430a inputs the soft output data 95a, and outputs the soft output data composed of the systematic bit series data S, the first parity bit series data P1 and the second parity bit series data P2.

The encoder 431a is provided with a sign/absolute value separation circuit 22_1 separating the soft input data into "sign" from "absolute value" thereof, a switch 23_1 inputting "sign", a multiplier 24_1, delay circuits 25_1-25_3, a multiplier 24_3 which inputs output signals of the delay circuits 25_2 and 25_3 to be provided to an input terminal of the multiplier-24_1, and a multiplier 24_5 which inputs the output signal of the switch 23_1 and the output signal "absolute value" of the separation circuit 22_1 to output the systematic bit series data S, connected in series.

Furthermore, the encoder 431a is composed of a multiplier 24_2 which inputs the output signals of the multiplier 24_1 and the delay circuit 25_1, a multiplier 24_4 which inputs the output signals of the multiplier 24_2 and the delay circuit 25_3, and a multiplier 24_6 which inputs the output signal and the "absolute value" of the multiplier 24_4 to output the first parity bit series data P1.

The encoder 432a has the same arrangement as that of the encoder 431a, and a multiplier 24_12 corresponding to the multiplier 24_6 outputs the second parity bit series data P2.

The SISO encoder 430a is a turbo encoder which obtains a soft output by multiplying the prior art turbo encoded result by the absolute value of the input soft output data. Namely, the SISO encoder 430a replaces the EXOR calculator of the prior art turbo encoder by a multiplier, inputs real values {+1, −1} instead of the logical values {0, 1}, and outputs a bit string of the real values {+1, −1} instead of a bit string of {0, 1}, as the encoding result.

The SISO encoder 430a multiplies the encoded bit series data outputted as the real values {+1, −1} by the absolute value of the input, thereby obtaining the result of the soft output encoding.

Figure 11:
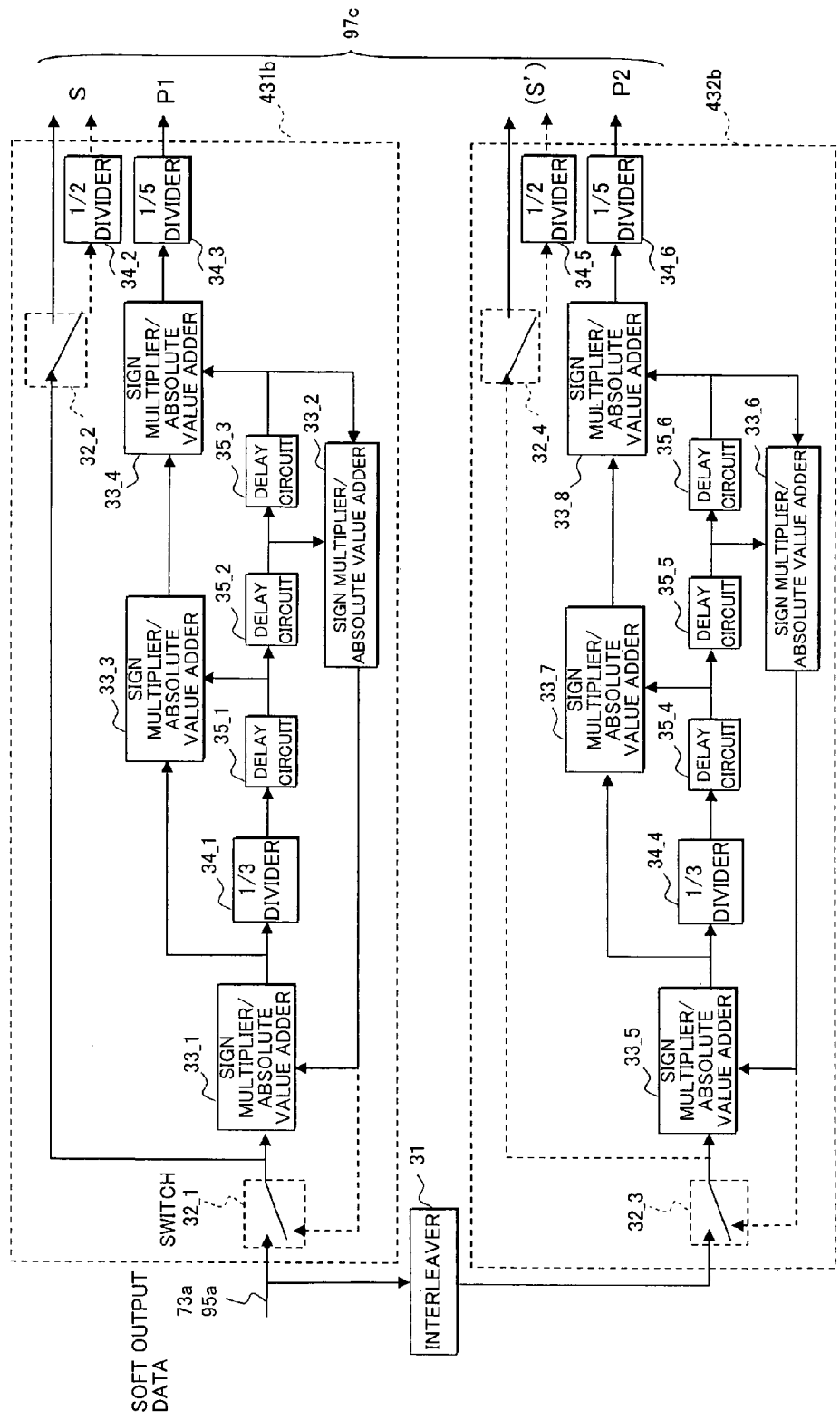
FIG. 11 is an arrangement (2) of an SISO turbo encoder in an error control apparatus according to the present invention.

FIG. 11 shows an embodiment (2) of the SISO encoder 430b shown in FIG. 8. This SISO encoder 430b is arranged so as to multiply the sign, instead of the EXOR calculator of the turbo encoder, to add the absolute value, and to arithmetically average the addition result.

The SISO encoder 430b is composed of encoders 431b and 432b, and an interleaver 31. The encoder 431b is provided with a switch 32_1 which inputs the soft output data 95a as the soft input data, a sign multiplier/absolute value adder 33_1, a 1/3 divider 34_1, delay circuits 35_1-35_3, a sign multiplier/absolute value adder 33_2 which inputs the output signals of the delay circuits 35_2 and 35_3 and provides the output signals to the input terminal of the sign multiplier/absolute value adder 33_1, a switch 32_2 connected to the output terminal of the switch 32_1 to output the systematic bit series data S 32_2, and a 1/2 divider 34_2 connected to the other output terminal of the switch 32_2 to output a 1/2 signal of the systematic bit series data S, connected in series.

Furthermore, the encoder 431b is provided with a sign multiplier/absolute value adder 33_3 which inputs the output signals of the sign multiplier/absolute value adder 33_1 and the delay circuit 35_1, a sign multiplier/absolute value adder 33_4 which inputs the output signals of the sign multiplier/absolute value adder 33_3 and the delay circuit 35_3, and a 1/5 divider 34_3 which divides the output signal of the sign multiplier/absolute value adder 33_4 by five and outputs the first parity bit series data P1.

An encoder 432b has the same arrangement as that of the encoder 431b. A 1/5 divider 34_6 corresponding to the 1/5 divider 34_3 outputs the second parity bit series data P2.

Namely, the SISO encoder 430b multiplies the sign instead of the EXOR calculator of the prior art turbo encoder, adds an absolute value, divides the absolute value by the frequency of addition before storing in a shift register or an encoder output to obtain an arithmetic average, thereby obtaining a soft output encoding result.

The dividers 34_1-34_6 in FIG. 11 respectively perform divisions by the number of data in which the absolute value is added. For example, since the 1/3 divider 34_1 inputs data at the sign multiplier/absolute value adder 33_1, and the sign multiplier/absolute value adder 33_2 adds the absolute values of the delay circuits 35_2 and 35_3, the division is performed by 3.

Figure 12:
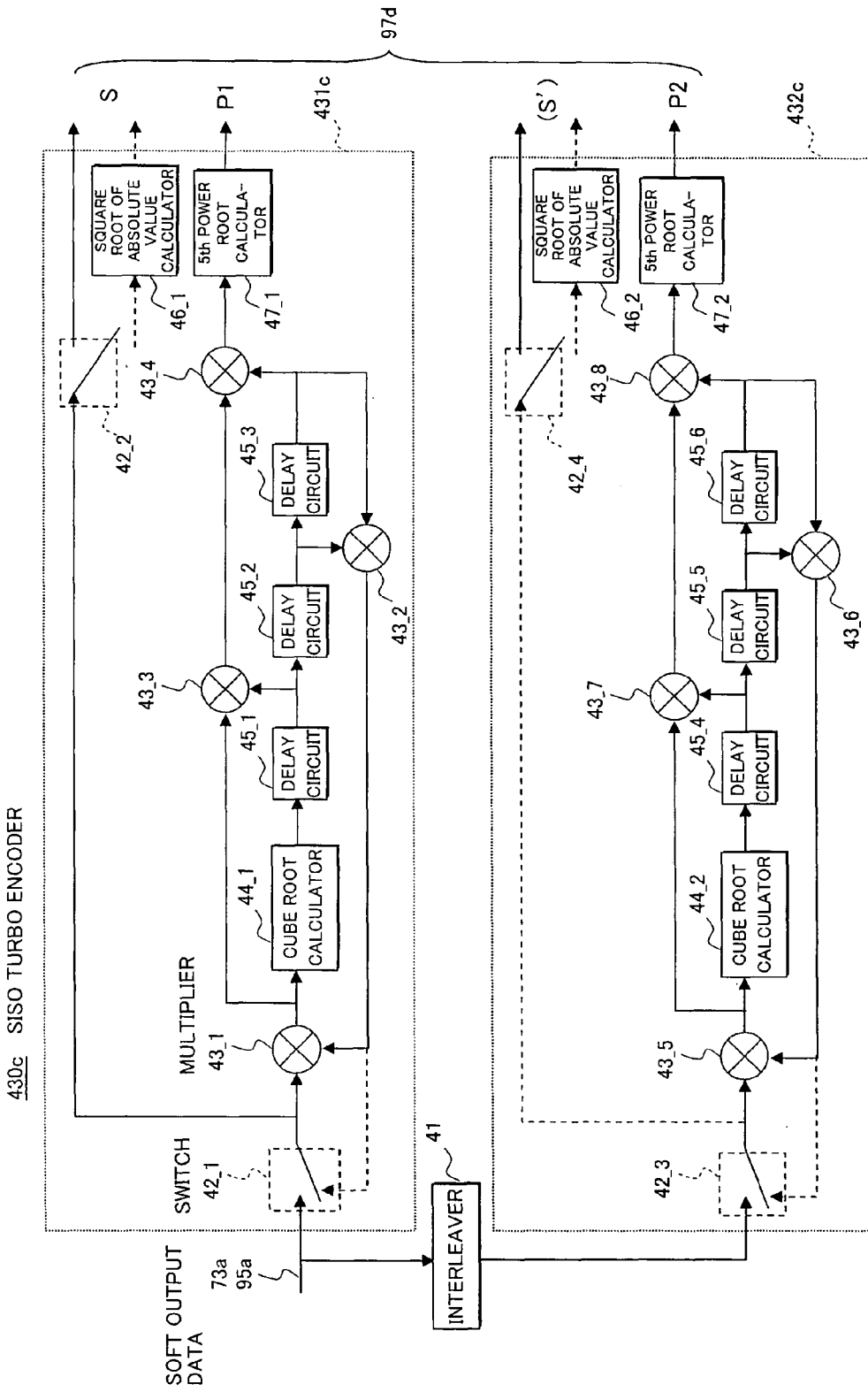
FIG. 12 is an arrangement (3) of an SISO turbo encoder in an error control apparatus according to the present invention.

FIG. 12 shows an embodiment (3) of an SISO encoder 430c shown in FIG. 8. This SISO encoder 430c is arranged so that the EXOR calculator of the turbo encoder is replaced by a multiplier, and the multiplication result is geometrically averaged.

The SISO encoder 430c is composed of encoders 431c and 432c, and an interleaver 41. The encoder 431c is provided with a switch 42_1 which inputs the soft input data (soft output data 95a), a multiplier 43_1, a cube root calculator 44_1, delay circuits 45_1-45_3, a multiplier 43_2 which inputs output signals of the delay circuits 45_2 and 45_3 and provides the output signals to the input terminal of the multiplier 43_1, a switch 42_2 connected to the output terminal of the switch 42_1 to output the systematic bit series data S, and an absolute value square root calculator 46_1 connected to the other output terminal of the switch 42_2 to output the absolute value square root of the systematic bit series data S, connected in series.

Furthermore, the encoder 431c is composed of a multiplier 43_3 which inputs the output signals of the multiplier 43_1 and the delay circuit 45_1, a multiplier 43_4 which inputs the output signals of the multiplier 43_3 and the delay circuit 45_3, and a fifth power root calculator 47_1 which obtains a 5th power root of the output signal of the multiplier 43_4 to output the first parity bit series data P1.

An encoder 432c has the same arrangement as that of the encoder 431c. A 5th power root calculator 47_2 corresponding to the 5th power root calculator 47_1 outputs the second parity bit series data P2.

The SISO encoder 430c replaces the EXOR calculator of the prior art turbo encoder by the multiplier, further takes Nth power root by a frequency N of multiplication of the absolute value before storing in the delay circuits (shift registers) 45_1-45_3 and before the output of the encoder, and geometrically averages them, thereby obtaining a soft output encoding result.

The Nth power root calculators in FIG. 12 respectively obtain an Nth power root with the number of data in which multiplication has been performed being made N. For example, the cube root calculator 44_1 obtains a cube root since the soft output data 95a are inputted by the multiplier 43_1, and the multiplication of the output data of the delay circuits 45_2 and 45_3 is performed by the multiplier 43_2.

Embodiment (5)

Figure 13:
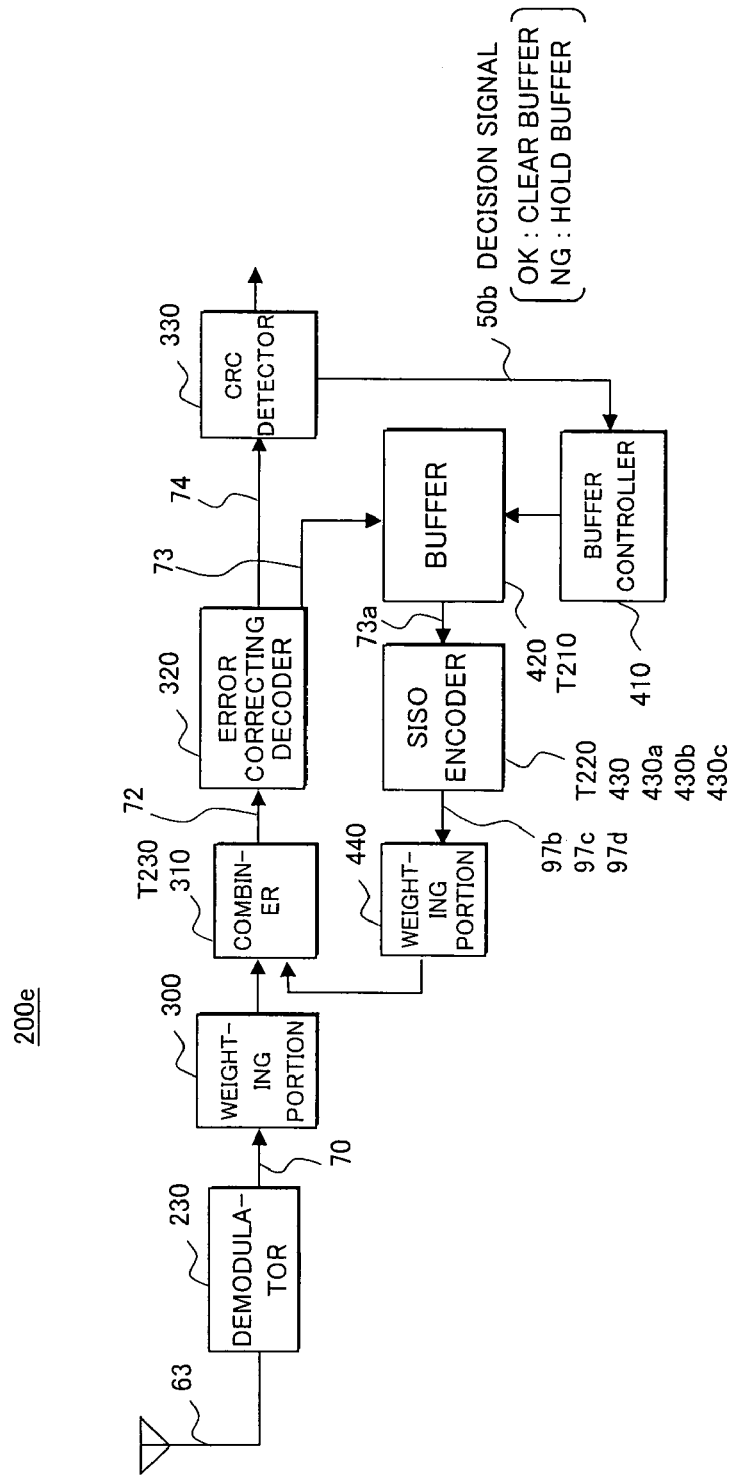
FIG. 13 is a block diagram showing an embodiment (5) of an error control apparatus according to the present invention.

FIG. 13 shows an embodiment (5) of the error control apparatus of the present invention. While the embodiment (4) shown in FIG. 8 indicates a case where the error control apparatus is applied to the receiving system corresponding to the transmitting system prescribed by the 3GPP, the embodiment (5) indicates an example in which a more general demodulation method is used and the interleaving and the rate matching are not performed.

Accordingly, in the embodiment (5), the de-spreader 210, the rake combiner 220, the deinterleaver 240, the bit separator 250, the second rate matching portion 260, the first rate matching portion 280, the bit collector 290 in the embodiment (4) shown in FIG. 8 are not included, and the demodulator 230 and the weighting portion 300 are directly connected.

Accordingly, the operation of the embodiment (5) is the same as that of the embodiment (4) except that the general demodulation is performed, and the deinterleaving and the rate matching are not performed.

FIGS. 14T-14X show data examples in the embodiment (5), which specifically indicates a case where a turbo code is used. Also, FIGS. 14T-14X show data 71_1-71_3 to which the S/P conversion is performed, the buffer 420, the SISO encoder 430, the weighting portion 440, the combiner 310, and the weighting portion 300, shown in FIG. 13, in order to facilitate understanding the relationship between the required memory capacity M3 of the buffer 420 and the required memory capacity M0 in the prior art example.

Figure 14:
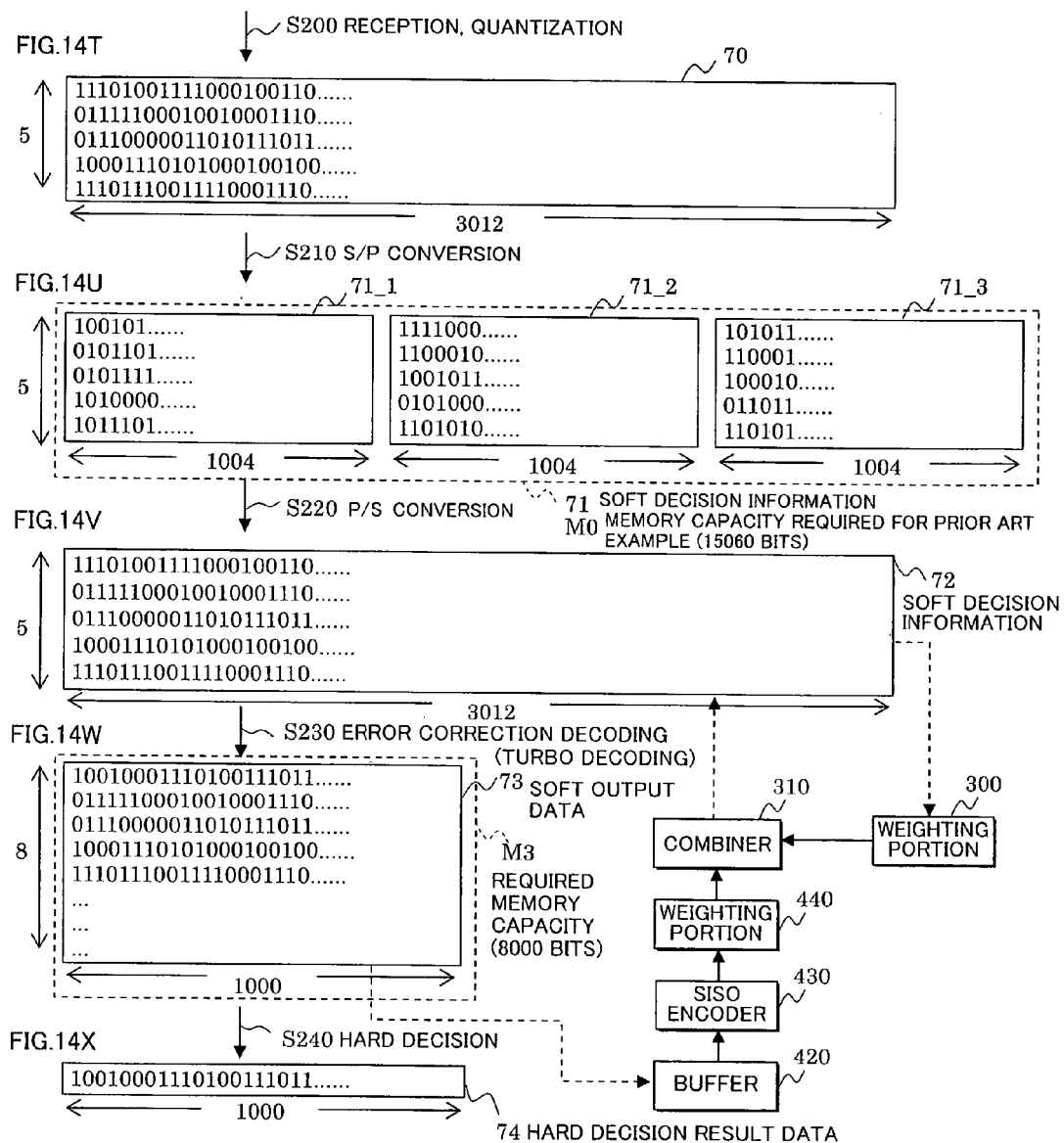
FIGS. 14T-14X are diagrams showing data examples in an embodiment (5) of an error control apparatus according to the present invention.

The buffer 420 stores the soft output data 73 of FIG. 14W. Accordingly, the required memory capacity M3 of the buffer 420 in the embodiment (5) is $8000/15060 \approx 8/15$ of the prior art required memory capacity M0.

Embodiment (6)

Figure 15:
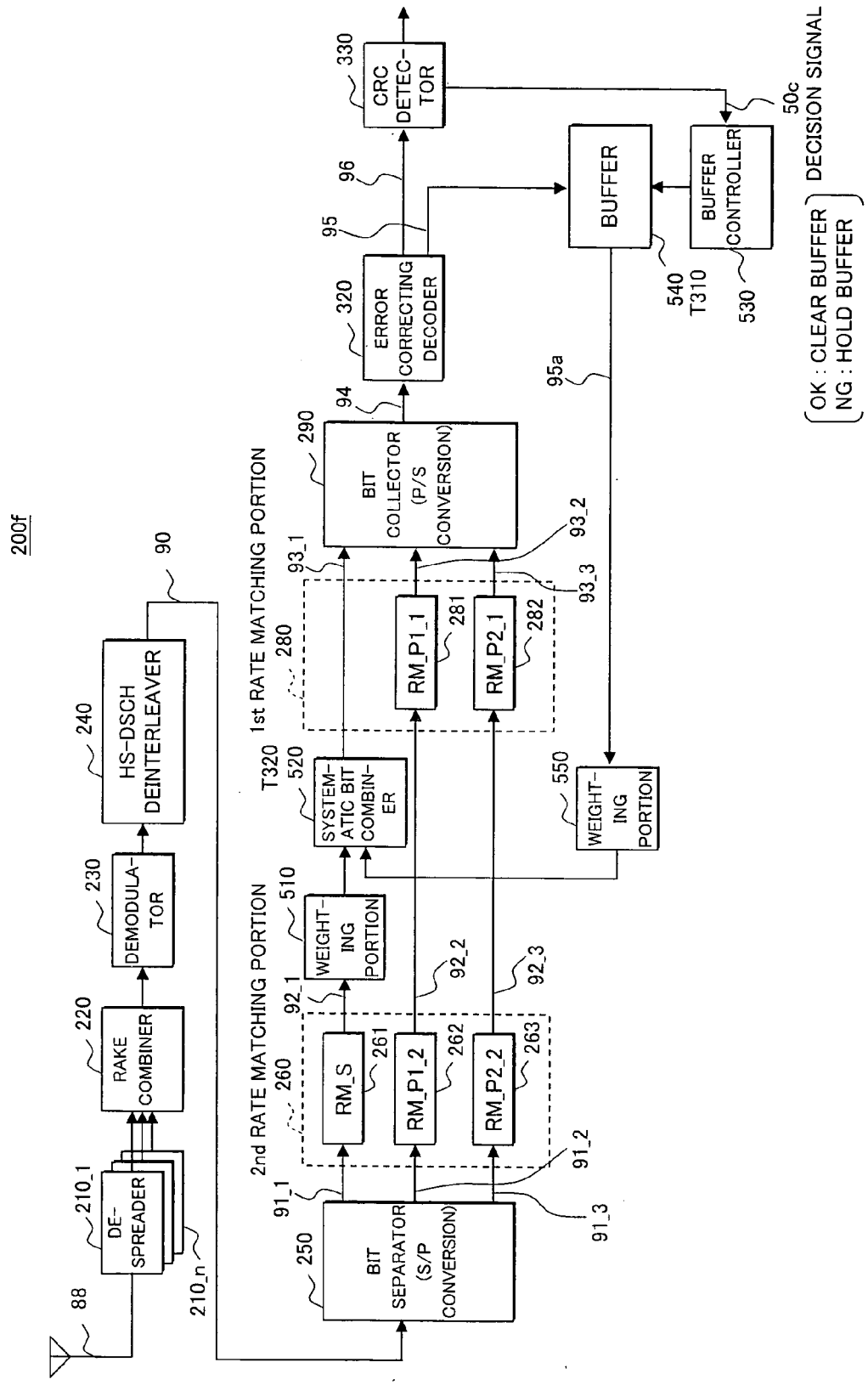
FIG. 15 is a block diagram showing an embodiment (6) of an error control apparatus according to the present invention.
Figure 16:
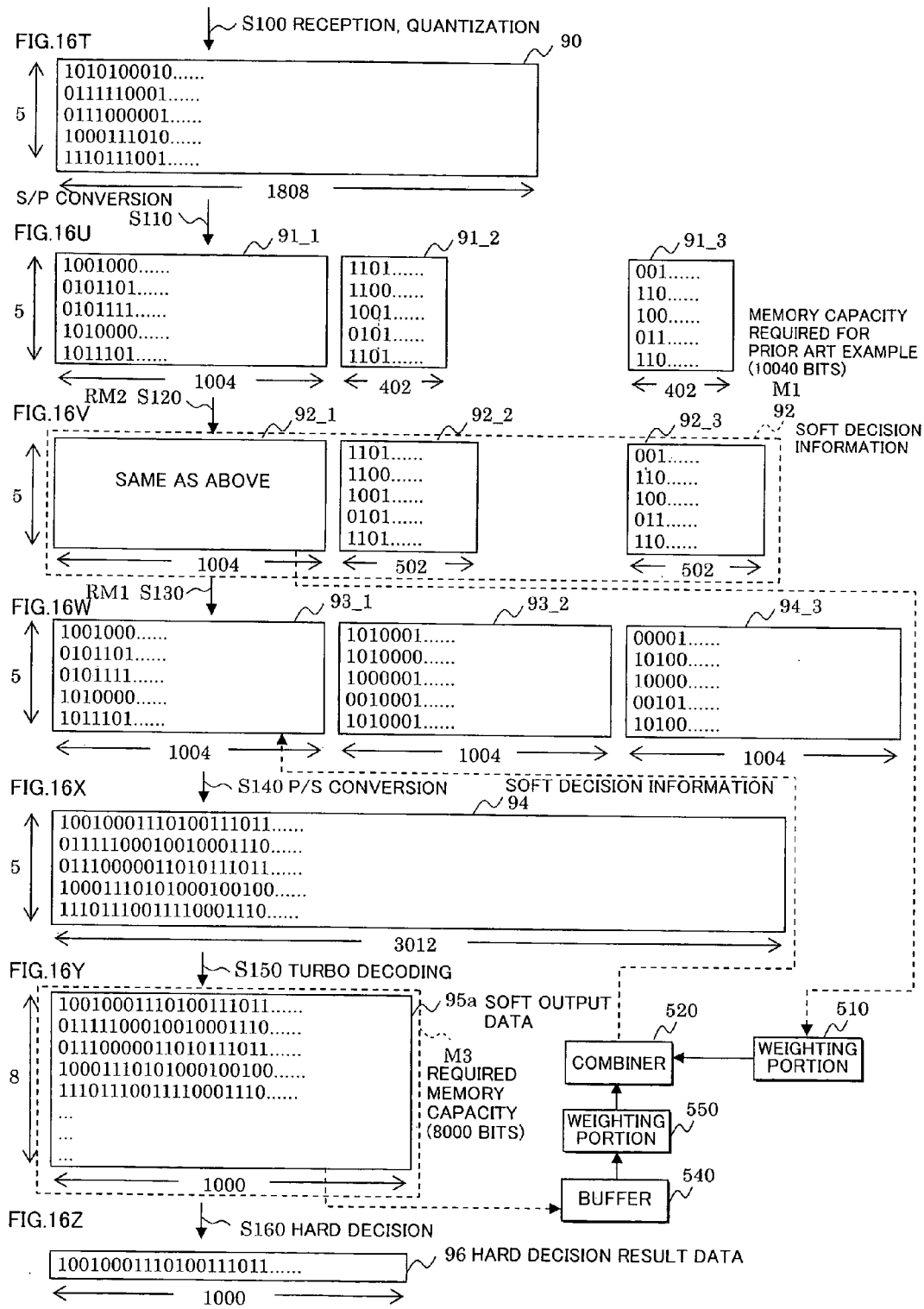
FIGS. 16T-16Z are diagrams showing data examples in an embodiment (6) of an error control apparatus according to the present invention.

FIG. 15 shows an embodiment (6) of an error control apparatus 200f of the present invention. This embodiment (6) is different from the embodiment (4) shown in FIG. 8 in that a combiner 520 combines soft output data 95a stored in a buffer 540 and a systematic bit 92_1 in the soft decision information 92 from the second rate matching portion 260 instead of the soft decision information 94 from the bit collector 290.

Accordingly, the arrangement of the embodiment (6) is different from that of the embodiment (4) in that a weighting portion 510 and the combiner 520 connected in series are connected to the terminal of the systematic bit 92_1 between the second rate matching portion 260 and the first rate matching portion 280, and the soft output data 95a from the buffer 540 are provided to the combiner 520 through the weighting portion 550.

FIGS. 16T-16Z show data examples of the embodiment (6). The data examples are the same as those of the embodiment (4) shown in FIGS. 9T-9Z except that the combiner 520 combines the data which are the soft output data 95a weighted and stored in the buffer 540 and data which are the systematic bit 92_1 of FIG. 16V.

Namely, the CRC detector 330 detects an error of the hard decision result data 96 and the data are retransmitted when the error is detected. The weighting portion 510 weights the systematic bit 92_1 within the retransmission data according to the S/N of the retransmission data or the like. Similarly, the weighting portion 550 weights the systematic bit of the soft output data 95a (see FIG. 16Y) held by the buffer 540.

The combiner 520 combines the systematic bit 92_1 (see FIG. 16V) of the soft decision information 92 weighted and retransmitted and the soft output data.

Namely, if the number of bits quantized of the soft output data 95a stored in the buffer 540 is supposed to be M="8", the required memory capacity M3 of the buffer 540 in the embodiment (6) is M3=8000 (8×1000) bits, which is $8000/10040 \approx 8/10$ of the prior art required memory capacity M1.

It is to be noted that the embodiment (6) can be applied only to the systematic code such as the turbo code.

Embodiment (7)

Figure 17:
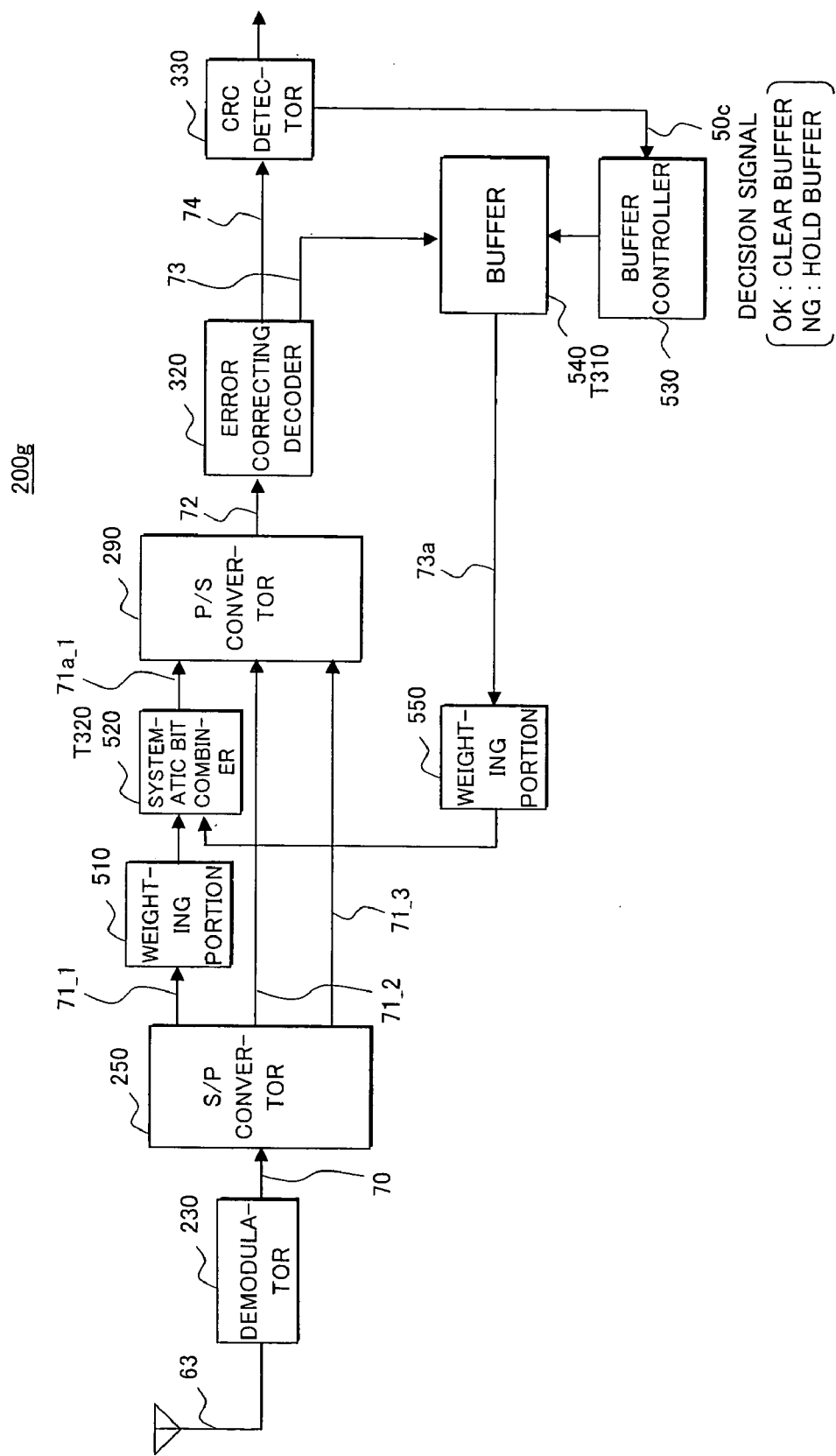
FIG. 17 is a block diagram showing an embodiment (7) of an error control apparatus according to the present invention.

FIG. 17 shows an embodiment (7) of an error control apparatus 200g of the present invention. Although the embodiment (6) shown in FIG. 15 is an example in the case where the error control apparatus is applied to a receiving system corresponding to the transmitting system prescribed by the 3GPP, the embodiment (7) indicates a more general error control apparatus.

The embodiment (7) indicates an example in which a general demodulation method is performed instead of demodulation of performing a de-spreading and rake combining in the embodiment (6), and the deinterleaving and the rate matching are not performed.

The arrangement for processing related to the HARQ of the error control apparatus 200g is the same of that of the embodiment (6). However, the de-spreader 210, the rake combiner 220, the deinterleaver 240, the second rate matching portion 260 and the first rate matching portion 280 in the embodiment (6) shown in FIG. 15 are not included, and the weighting portion 510 and the combiner 520 are connected in series between the terminals of the systematic bit series data 71_1 of an S/P converter 250 and a P/S converter 290.

Accordingly, the operation of the embodiment (7) is the same as that of the embodiment (6) except that the general demodulation is performed, and the deinterleaving and the rate matching are not performed.

The S/P converter 250 divides demodulated series data 70 outputted from the demodulator 230 into the systematic bit series data 71_1, the first parity bit series data 71_2, the second parity bit series data 71_3 to be outputted in parallel, and performs processing corresponding to the bit separator 250 in FIG. 15.

Also, the P/S converter 290 outputs serially systematic bit series data 71a_1, first parity bit series data 71_2, and second parity bit series data 71_3 inputted in parallel and performs processing corresponding to the bit collector 290 in FIG. 15.

FIGS. 18T-18X show data examples in the embodiment (7), which specifically indicates a case where the turbo code is used. Also FIGS. 18T-18X show the buffer 540, the weighting portion 550, the combiner 520 and the weighting portion 510 shown in FIG. 17 in order to facilitate understanding the relationship between the required memory capacity M3 of the buffer 540 and the prior art required memory capacity M0.

Figure 18:
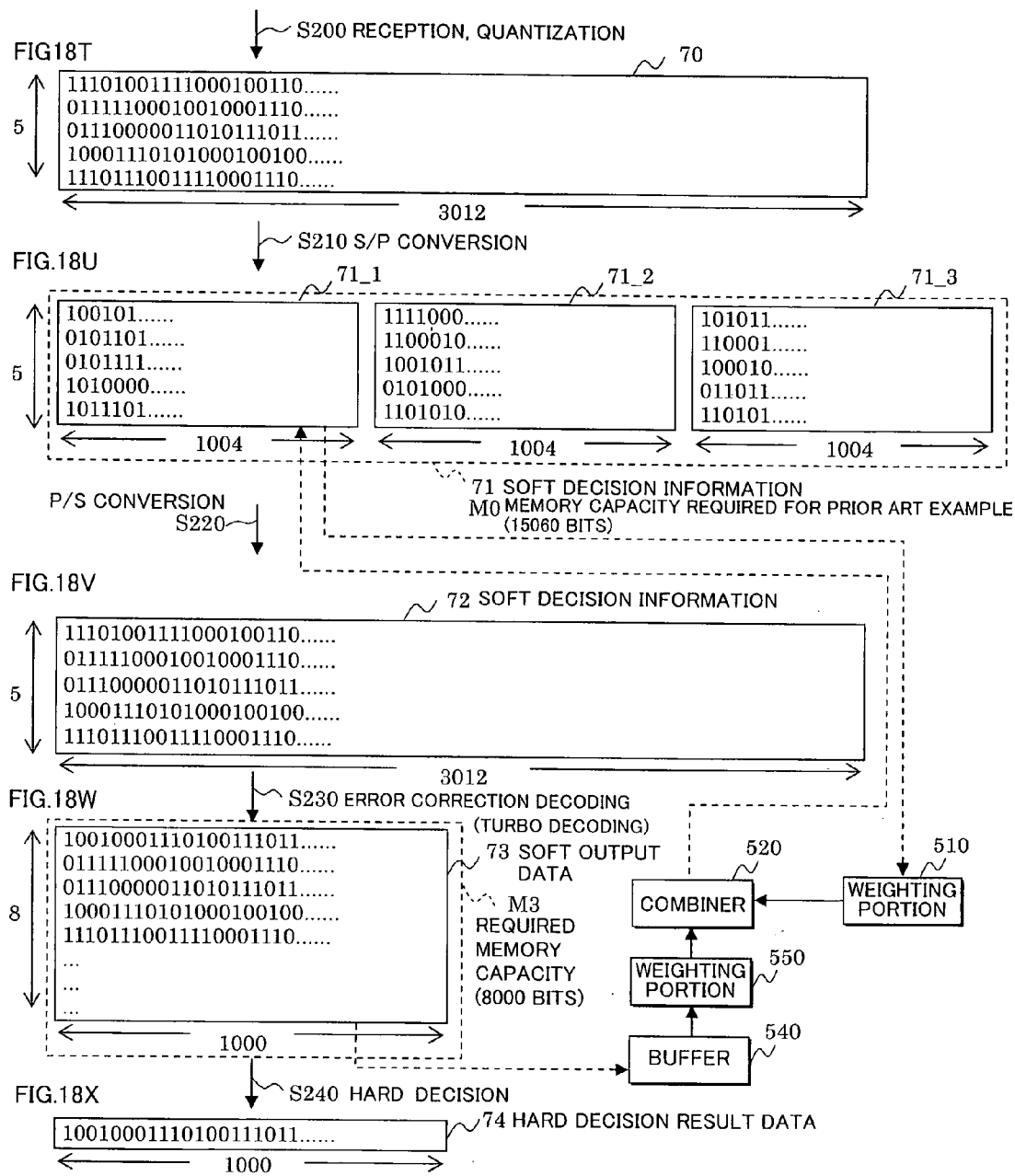
FIGS. 18T-18X are diagrams showing data examples in an embodiment (7) of an error control apparatus according to the present invention.

The buffer 540 stores the soft output data 73 of FIG. 18W. Accordingly, the required memory capacity M3 of the buffer 540 in the embodiment (7) is $8000/15060 \approx 8/15$ of the prior art required memory capacity M0.

Embodiment (8)

Figure 19:
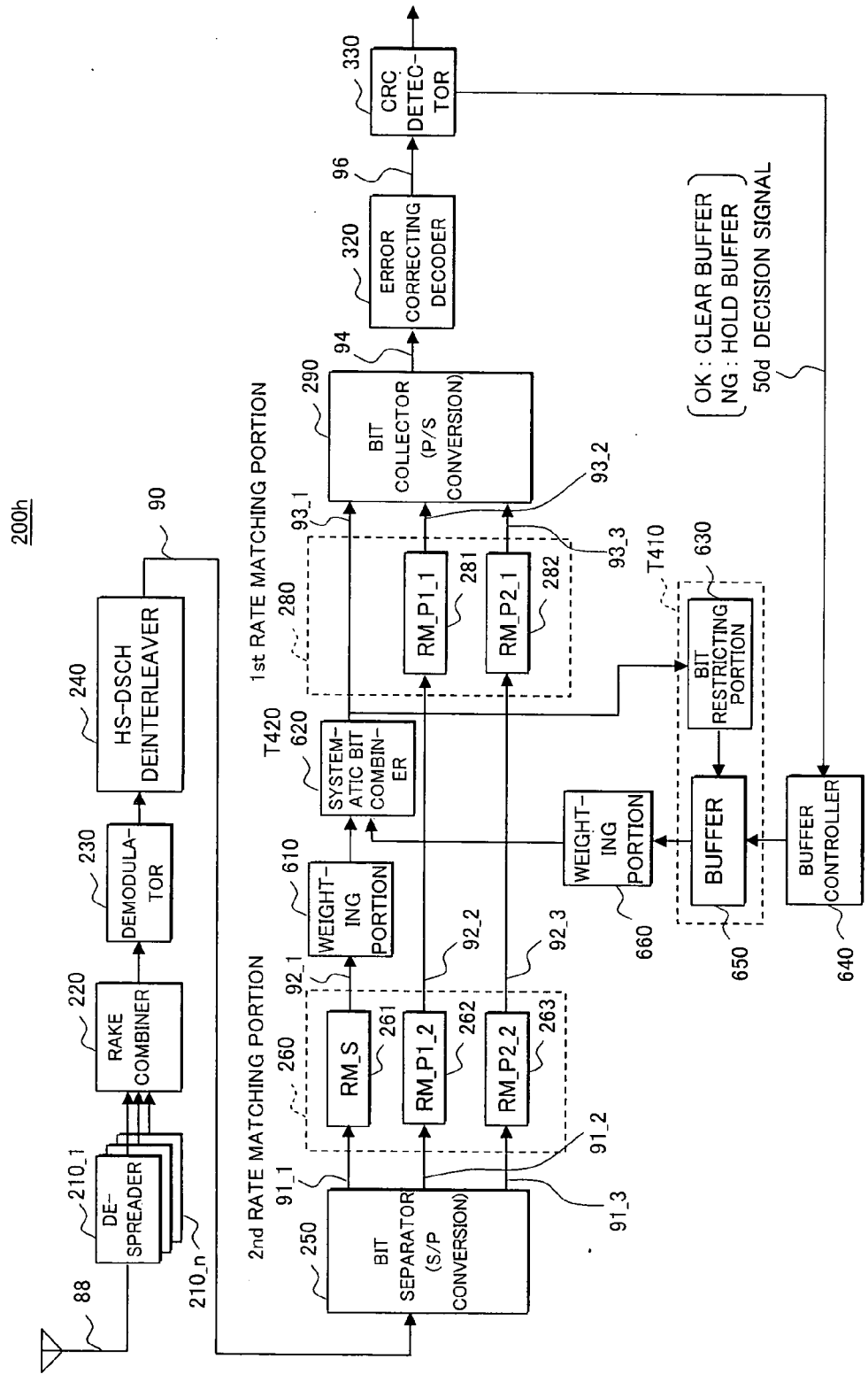
FIG. 19 is a block diagram showing an embodiment (8) of an error control apparatus according to the present invention.
Figure 20:
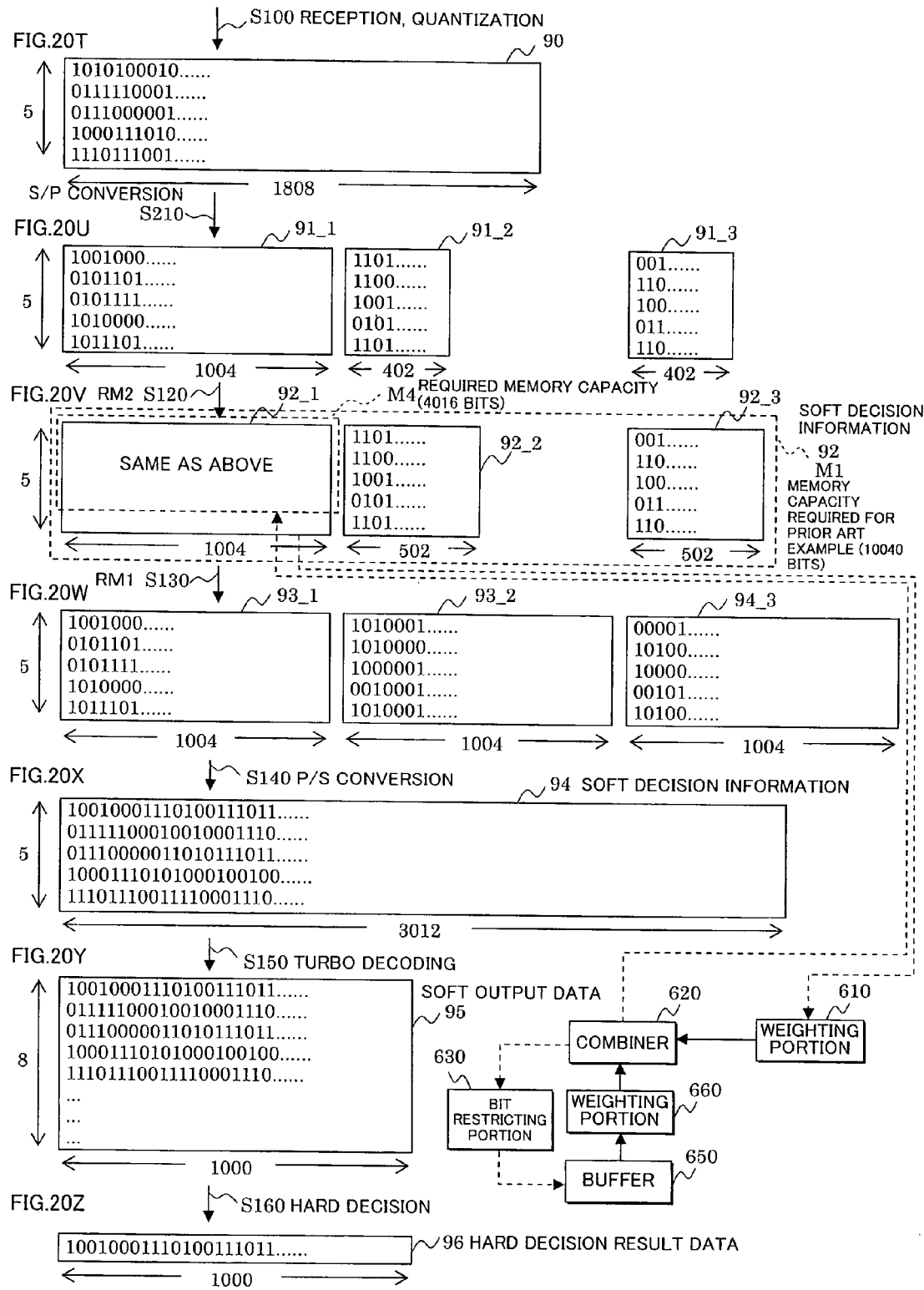
FIGS. 20T-20Z are diagrams showing data examples in an embodiment (8) of an error control apparatus according to the present invention.

FIG. 19 shows an embodiment (8) of an error control apparatus 200h of the present invention, which is an example in a case where the error control apparatus is applied to the receiving system corresponding to the transmitting system prescribed by the 3GPP. The embodiment (8) is different from the prior art example shown in FIG. 33 in that a buffer 650 stores only the systematic bit 92_1 of the soft decision information 92, and a combiner 620 combines systematic bit series data stored in the buffer 650 and the systematic bit 92_1 within the retransmitted soft decision information 92. Furthermore, it is also different from the prior art example that the number of bits of the systematic bit 92_1 stored by the buffer 650 is restricted.

The arrangement of the embodiment (8) is the same as that of the prior art example from the de-spreader 210 to the second rate matching portion 260. The arrangement of the embodiment (8) is different from that of the prior art example in that a weighting portion 610 and the combiner 620 connected in series are connected between the terminals of the second rate matching portion 260 and the systematic bit 92_1 of the first rate matching portion 280, and a bit restricting portion 630 which restricts the number of bits of the systematic bit 92_1 from the combiner 620 is connected between the combiner 620 and the buffer 650, and the output terminal of the buffer 650 is connected to the combiner 620 through the weighting portion 660.

FIGS. 20T-20Z show data examples in the embodiment (8), which are the same as those of the prior art data examples shown in FIGS. 34T-34Z. However, FIGS. 20T-20Z show data to be stored, the weighting portion 610, the combiner 620, the bit restricting portion 630, the buffer 650 and the weighting portion 660 shown in FIG. 19, in order to facilitate understanding the relationship between the required memory capacity M4 of the buffer 650 and the prior art required memory capacity M1.

The operation of the error control apparatus 200h will now be described referring to FIGS. 20T-20Z.

The combiner 620 receives the systematic bit 92_1 (see FIG. 20V) of the soft decision information weighted from the second rate matching portion 260 through the weighting portion 610.

The combiner 620 provides the weighted systematic bit 92_1 to the bit restricting portion 630 upon the first data transmission. The bit restricting portion 630 provides the data (see M4 of FIG. 20V) where the number of bits of the systematic bit 92_1 is restricted to the buffer 650, which holds the systematic bit 92_1 where the bits are restricted.

The systematic bit 93_1 outputted from the combiner 620 is provided to the bit collector 290 through the first rate matching portion 280. The bit collector 290 provides the soft decision information 94 (see FIG. 20X) where the systematic bit 93_1, the first parity bit 93_2 and the second parity bit 93_3 (see FIG. 20W) are collected to the error correcting decoder 320.

An error correction decoding is performed to the soft decision information 94 by the error correction decoder 320, and the hard decision result data 96 (see FIG. 20Z) which are decoding results are detected by the CRC detector 330. When the error is detected, the data retransmission is performed.

The systematic bit 92_1 in the soft decision information 92 retransmitted and the systematic bit 92_1 where the bits are restricted held in the buffer 650 are respectively provided to the combiner 620 as data weighted corresponding to the S/N or the like of the reception signal by the weighting portions 610 and 660. The combiner 620 combines the data. When an error is detected, the bit restriction is performed to the combined data to be held in the buffer.

For example, when the number of bits quantized of the soft decision information 92 held by the buffer 650 is restricted to M="4", the required memory capacity of the buffer 650 assumes M4=4016 bits, which is $^{4016}/_{10040}$=$^{2}/_{5}$ of the prior art required memory capacity M1=10040.

It is to be noted that the embodiment (8) can be applied only to the systematic code such as a turbo code.

Embodiment (9)

Figure 21:
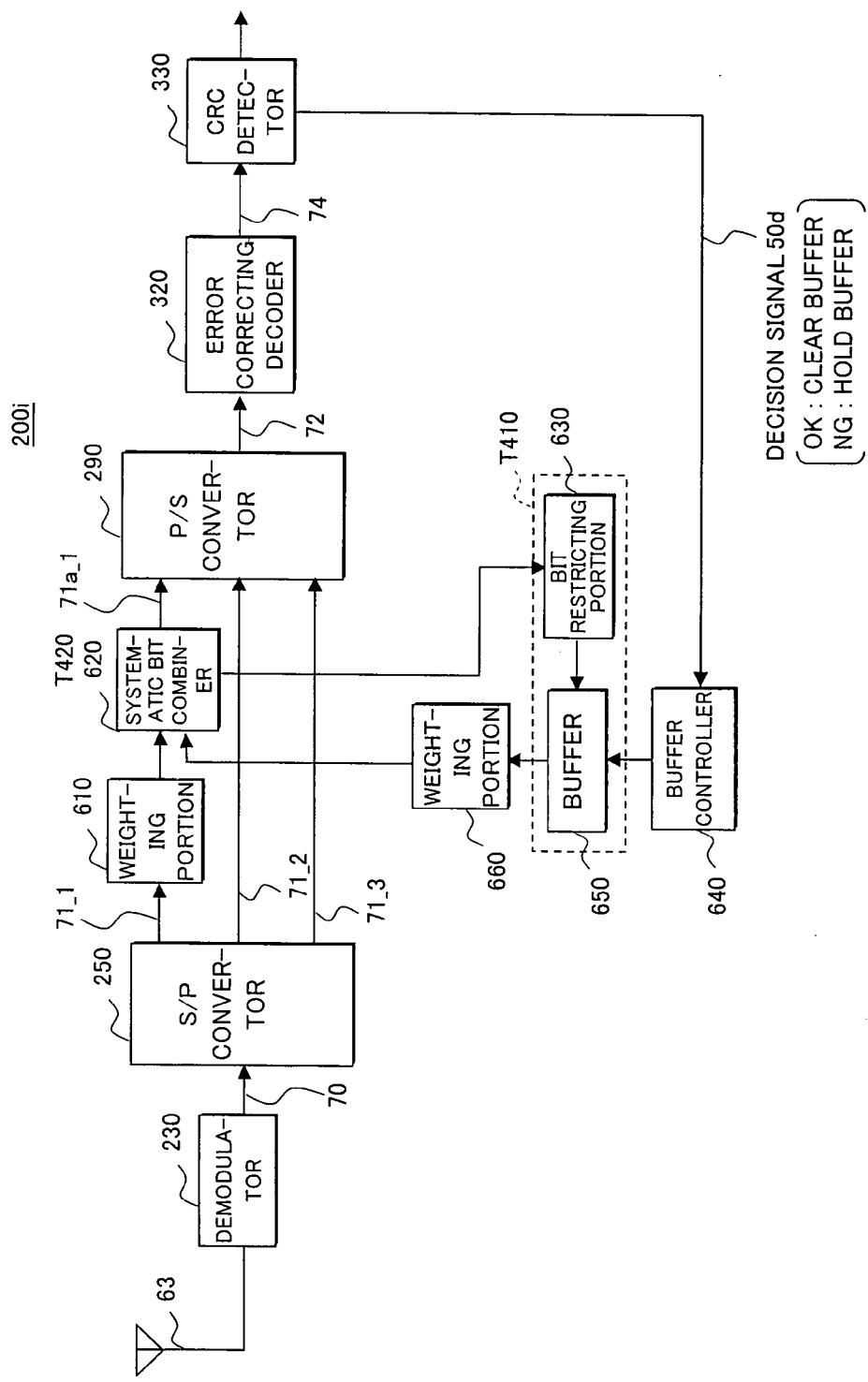
FIG. 21 is a block diagram showing an embodiment (9) of an error control apparatus according to the present invention.
Figure 22:
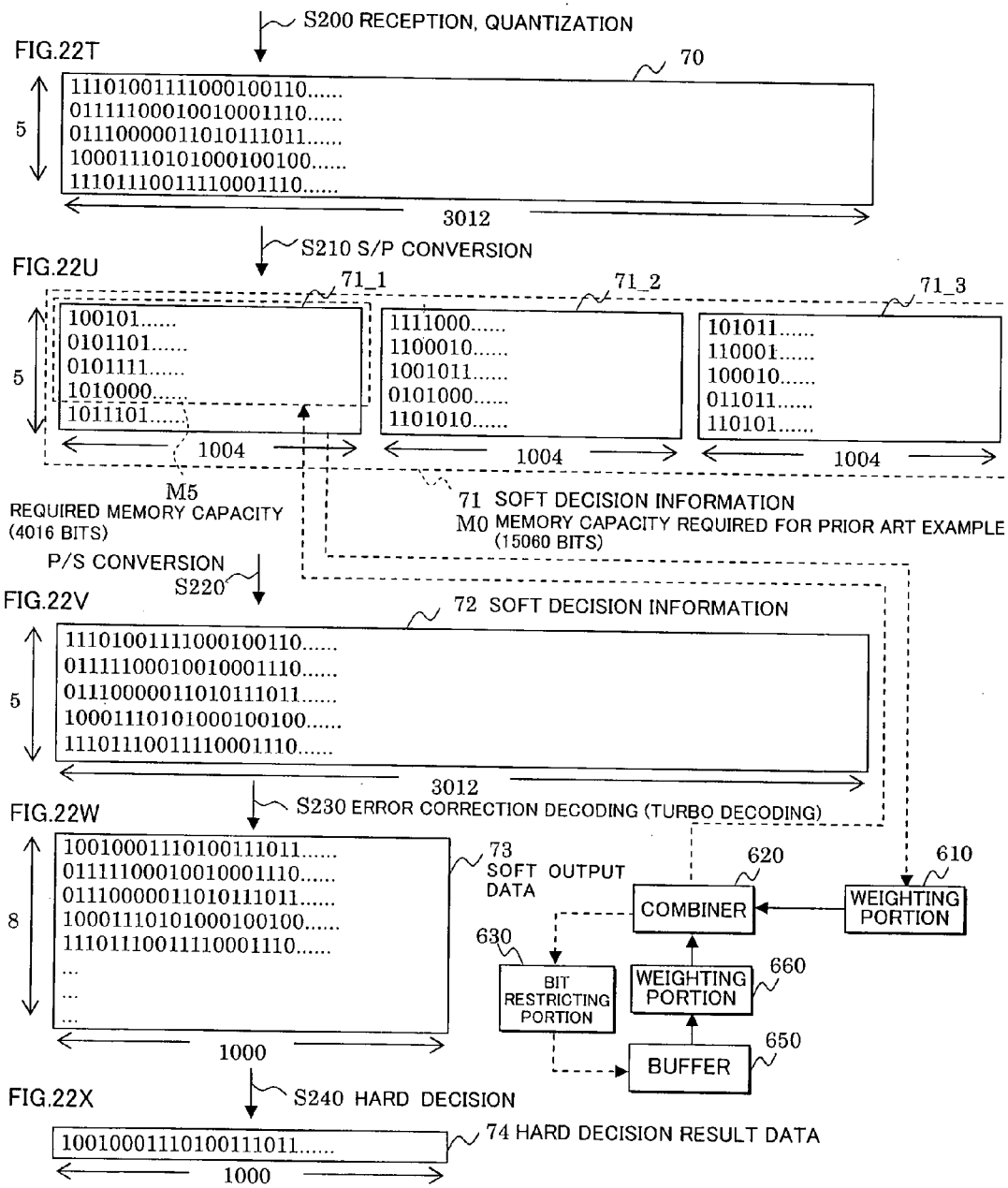
FIGS. 22T-22X are diagrams showing data examples in an embodiment (9) of an error control apparatus according to the present invention.

FIG. 21 shows an embodiment (9) of an error control apparatus 200$i$ of the present invention. The embodiment (9) shows an example in which a general communication method (decoding method) is adopted and the deinterleaving and the rate matching are not performed in the embodiment (8) shown in FIG. 19.

Accordingly, the error control apparatus 200$i$ does not include the de-spreader 210, the rake combiner 220, the deinterleaver 240, the second rate matching portion 260, and the first rate matching portion 280 in the embodiment (8), wherein the S/P converter 250 and the P/S converter 290 are arranged instead of the bit separator 250 and the bit collector 290.

Also, the operation of the embodiment (9) is the same as that of the embodiment (8) except that a general demodulation is performed and the deinterleaving and the rate matching are not performed.

FIGS. 22T-22X show data examples in the embodiment (9), which specifically indicates a case where the turbo code is used. The buffer 650 stores the systematic bit 71_1 (see M5 of FIG. 22U). Accordingly, when the number of quantized bits is restricted to M="4", the required memory capacity M5 of the buffer 650 assumes "4016", which is $^{4016}/_{15060}$=$^{4}/_{15}$ of the prior art required memory capacity M0=15060 bits.

Embodiment (10)

Figure 23:
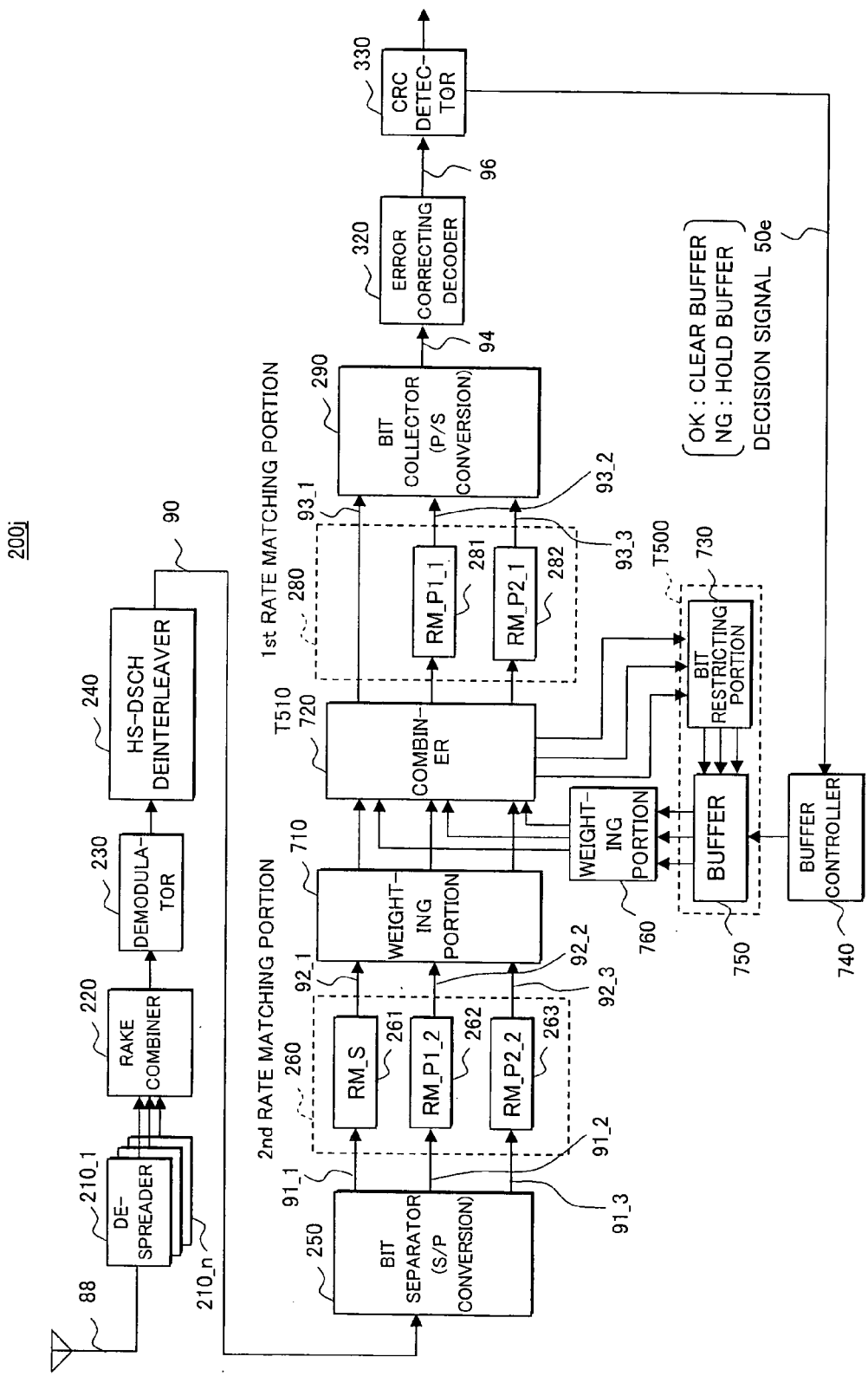
FIG. 23 is a block diagram showing an embodiment (10) of an error control apparatus according to the present invention.

FIG. 23 shows an embodiment (10) of an error control apparatus 200$j$ of the present invention, which is an example in which the error control apparatus is applied to the receiving system corresponding to the transmitting system prescribed by the 3GPP. The embodiment (10) is different from the prior art example shown in FIG. 33 in that a buffer 750 stores only the data where bits of the soft decision information 92 (systematic bit 92_1, first parity bit 92_2 and second parity bit 92_3) are restricted, and a combiner 720 combines the data which are the soft decision information 92 weighted and stored in the buffer 750, and the data which are the retransmitted soft decision information 92 weighted.

Accordingly, the arrangement of the embodiment (10) is different from the prior art example shown in FIG. 33 in that a weighting portion 710 is inserted between the second rate matching portion 260 and the combiner 720, a bit restricting portion 730 is inserted between the output terminal of the combiner 720 and the input terminal of the buffer 750, and a weighting portion 760 is inserted between the output terminal of the buffer 750 and the input terminal of the combiner.

FIGS. 24T-24Z show data examples of the embodiment (10) which are the same as those in the prior art in FIGS. 34T-34Z. However, FIGS. 24T-24Z show the weighting portion 710, the combiner 720, the bit restricting portion 730, in order to facilitate understanding the relationship between the required memory capacity M6 of the buffer 750 and the prior art required memory capacity M1.

The operation of the embodiment (10) will now be described referring to FIGS. 24T-24Z.

Figure 24:
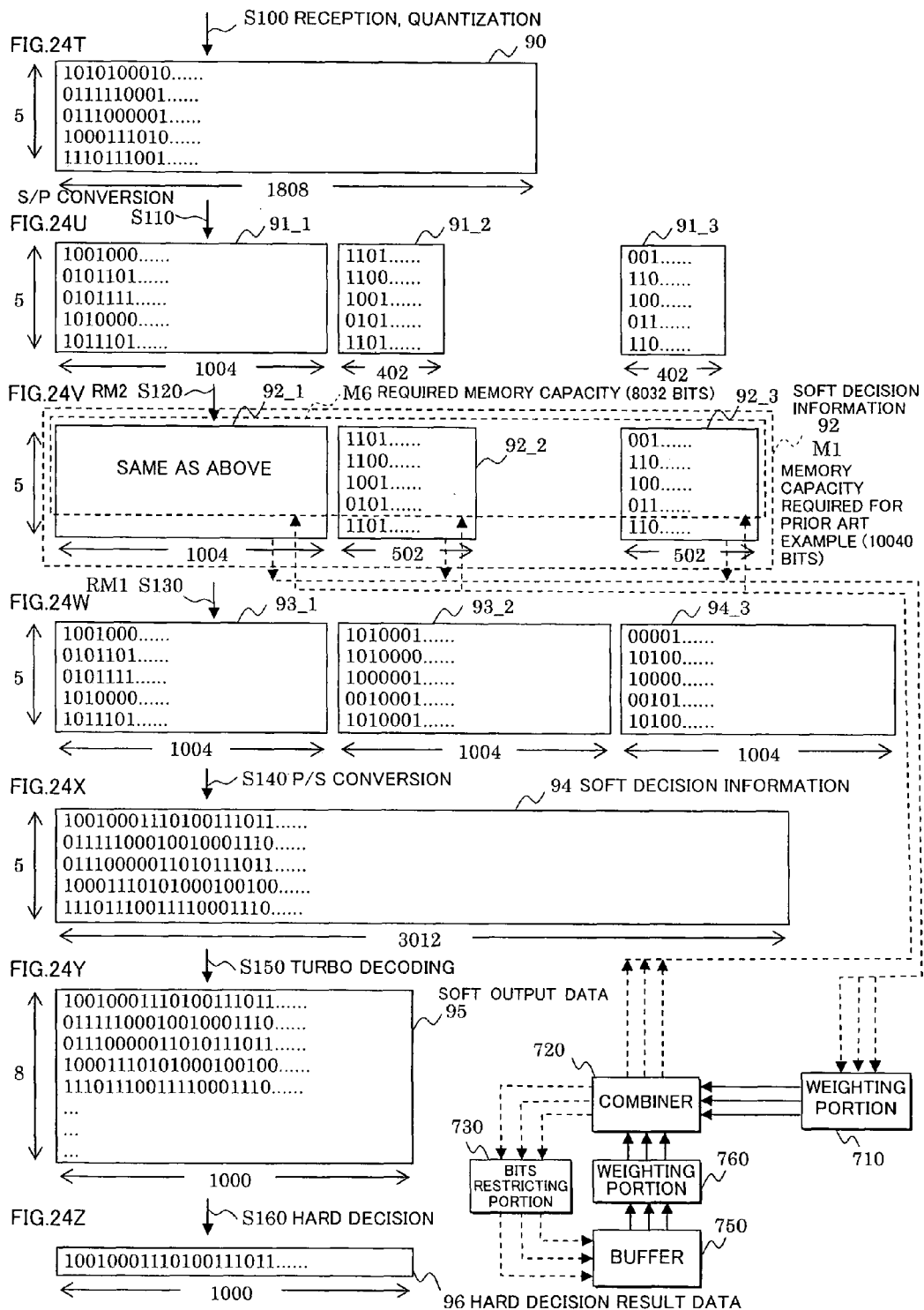
FIGS. 24T-24Z are diagrams showing data examples in an embodiment (10) of an error control apparatus according to the present invention.

The weighting portion 710 weights the soft decision information 92 (systematic bit 92_1, first parity bit 92_2 and second parity bit 92_3 of FIG. 24V) from the second rate matching portion 260 to be provided to the combiner 720 upon the first data transmission. The combiner 720 provides the soft decision information 92 weighted to the bit restricting portion 730. The bit restricting portion 730 provides the data (see M6 of FIG. 24V) where the number of bits of the weighted soft decision information 92 is restricted to the buffer 750, which holds the restricted data.

It is to be noted that weighting in the weighing portions 710 and 760 is performed according to the S/N or the like of the reception data.

Also, the weighted soft decision information 92 is provided to the error correcting decoder 320 as the soft decision information 94 through the first rate matching portion 280 and the bit collector 290. The error correcting decoder 320 outputs the hard decision result data 96 which are the soft decision information 94 to which an error correction decoding is performed. The CRC detector 330 detects an error of the hard decision result data 96 and the data are retransmitted when the error is detected.

When the data are retransmitted, the combiner 720 combines the soft decision information 92 received through the second rate matching portion 260 and the weighting portion 710, and the data which are the soft decision information 92 held in the buffer 750 received through the weighting portion 760, and makes the combining result provided to the buffer 750, through the bit restricting portion 730, to be held.

Accordingly, supposing that the number of bits quantized of the soft decision information held is M="4", the buffer required memory capacity M6 assumes "8032 bits" in the embodiment (10), which is M/Nr=$^{4}/_{5}$ compared with the required memory capacity M1="10040" of the prior art example, where Nr is the number of bits quantized of the soft decision information.

It is to be noted that the embodiment (10) can be applied not only to the systematic code but also a non-systematic code.

Embodiment (11)

Figure 25:
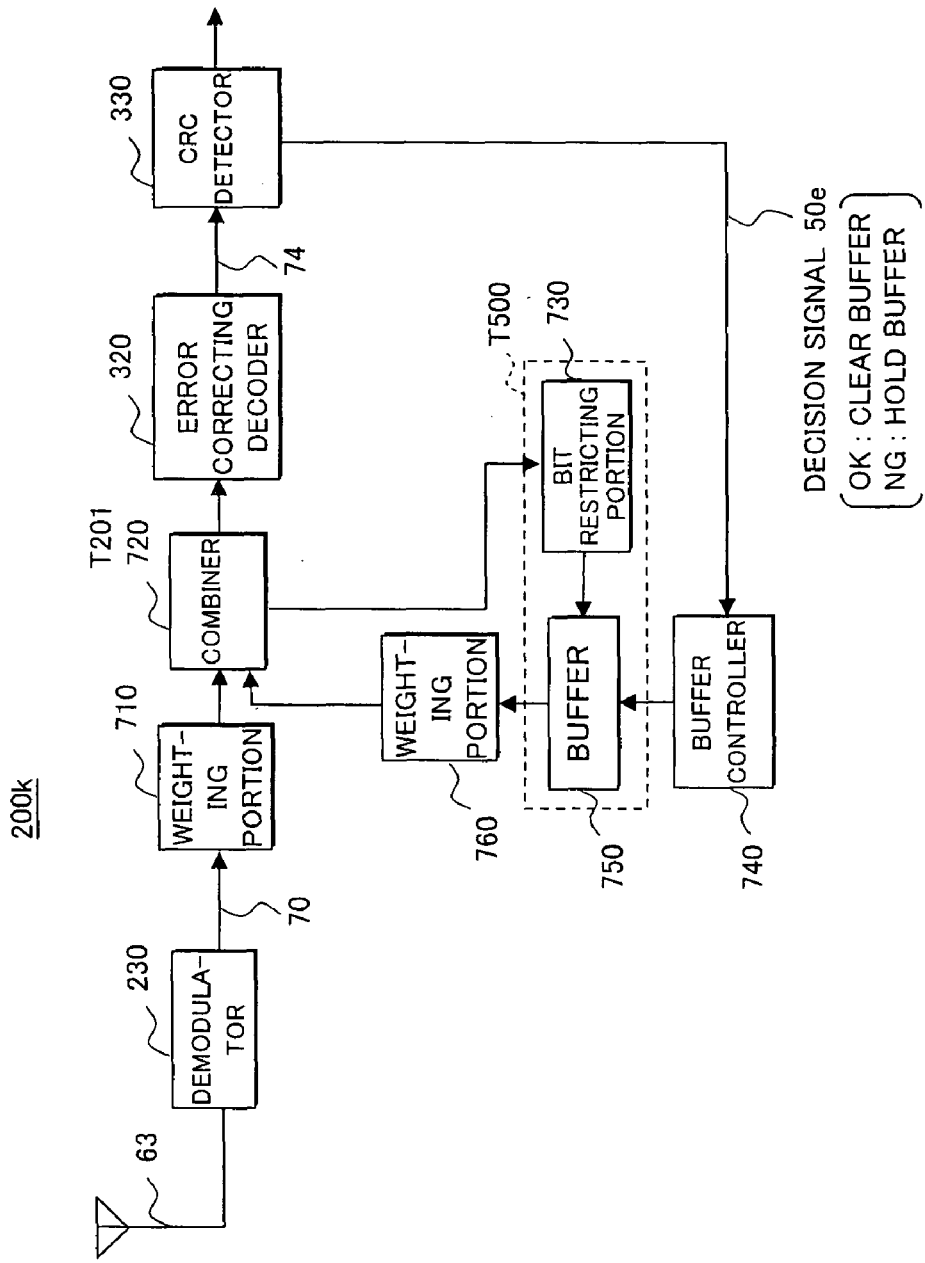
FIG. 25 is a block diagram showing an embodiment (11) of an error control apparatus according to the present invention.
Figure 26:
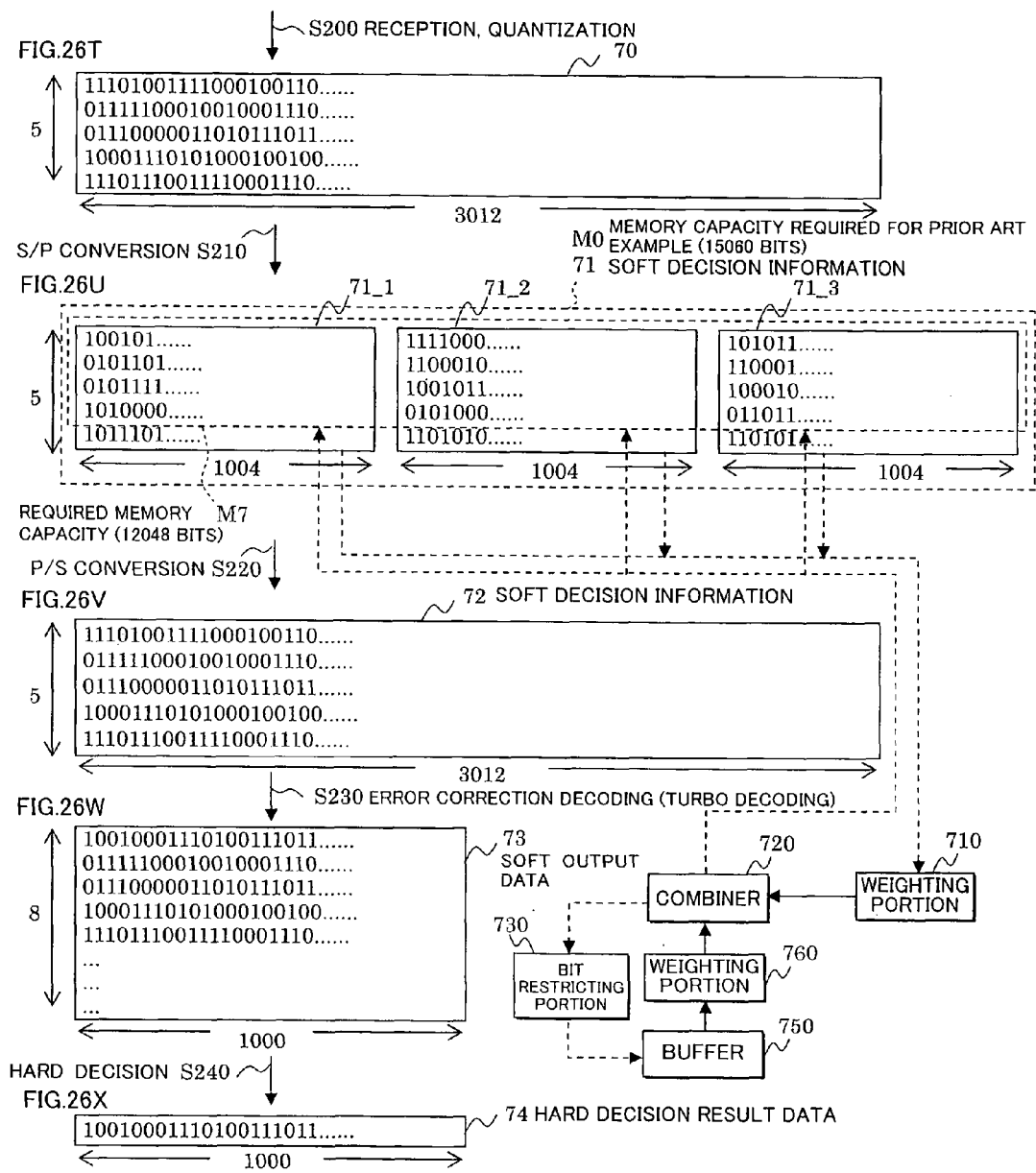
FIGS. 26T-26X are diagrams showing data examples in an embodiment (11) of an error control apparatus according to the present invention.

FIG. 25 shows an embodiment (11) of an error control apparatus 200$k$ of the present invention. This embodiment (11) indicates an example in which a general communication method, i.e. a general demodulation method is adopted and the deinterleaving and the rate matching are not performed in the embodiment (10) shown in FIG. 23.

The error control apparatus 200$k$ does not include the de-spreader 210, the rake combiner 220, the deinterleaver 240, the second rate matching portion 260, and the first rate matching portion 280 in the embodiment (10), and the weighting portion 710 and the combiner 720 connected in series are arranged between the demodulator 230 and the error correcting decoder 320.

Also, the arrangement of the bit restricting portion 730, the buffer 750, and the weighting portion 760 is the same as that of the embodiment (10) of FIG. 23.

FIGS. 26T-26X show data examples in the embodiment (11), which specifically indicates a case where the turbo code is used.

When the number M of bits quantized is restricted to 4 bits, the required memory capacity of the buffer 750 is $M6=4\times1004\times3=12048$ bits, which is $12048/15060=4/5$ of the prior art required memory capacity $M0=15060$.

Embodiment (12)

Figure 27:
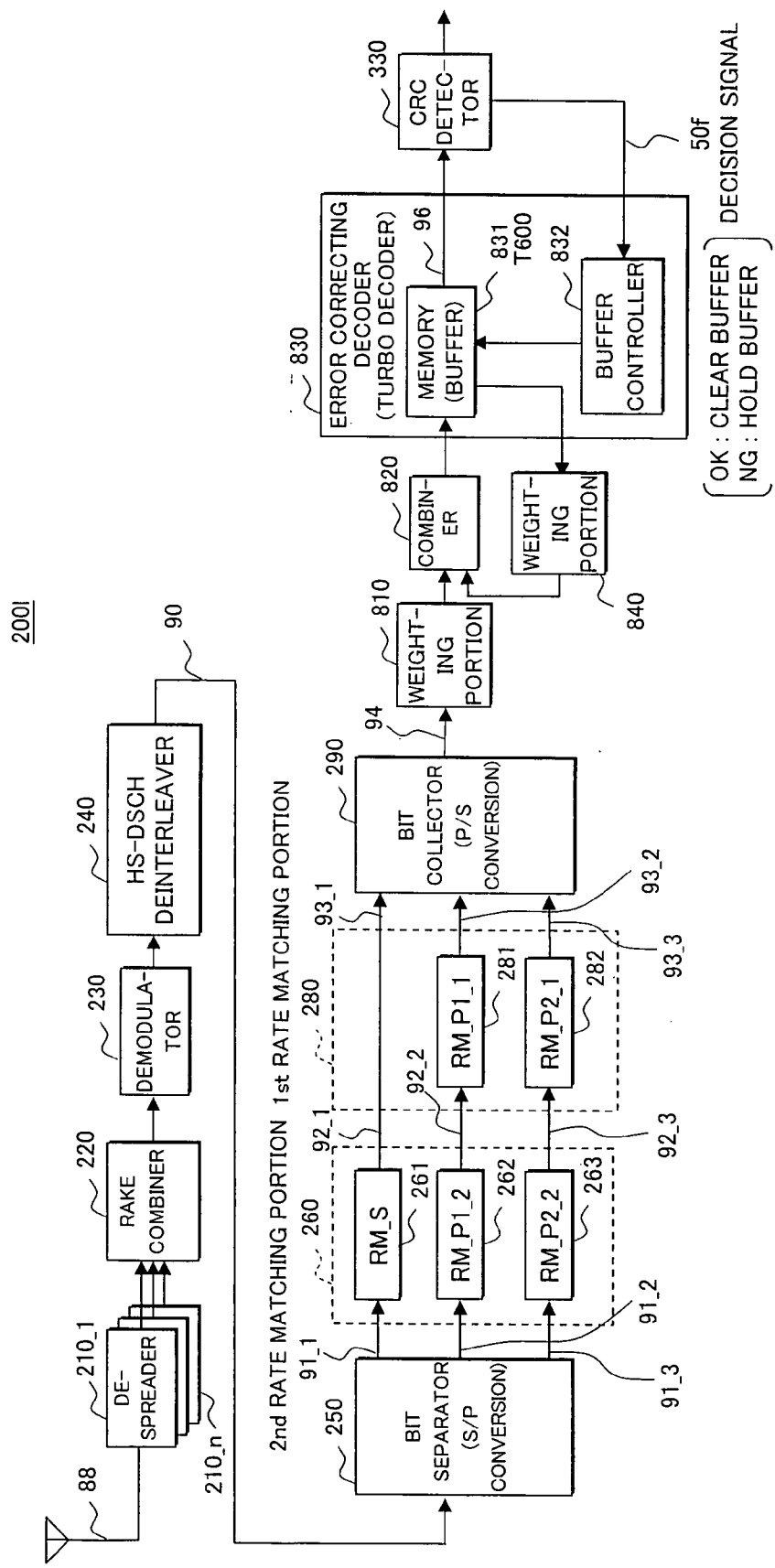
FIG. 27 is a block diagram showing an embodiment (12) of an error control apparatus according to the present invention.

FIG. 27 shows an embodiment (12) of an error control apparatus 2001 of the present invention, which is an example in which the error control apparatus is applied to the receiving system corresponding to the transmitting system prescribed by the 3GPP. A reception data storing memory 831 within a turbo decoder 830 is used as an HARQ buffer in the embodiment (12), thereby reducing the memory capacity of the buffer.

Namely, the turbo decoder 830 originally has the reception data storing memory 831 in order to repeatedly perform decoding by using the reception data. The memory 831 is also used as the HARQ buffer.

The arrangement of the error control apparatus 2001 is different from that of the prior art error control apparatus 200y shown in FIG. 33 in that the second rate matching portion 260 and the first rate matching portion 280 are directly connected, a weighting portion 810 and a combiner 820 connected in series are arranged between the bit collector 290 and a turbo decoder 830, and the output signal (reception data) of the combiner 820 is provided to the memory 831 within the turbo decoder 830.

Also, the error control apparatus 2001 is provided with a weighting portion 840, which weights the reception data stored in the memory 831 to be returned to the combiner 820. Furthermore, in the error control apparatus 2001, the turbo decoding memory is also used as a buffer for storing the reception data. Therefore, a buffer controller 832 of the turbo decoder 830 is included in a memory controller (not shown).

In operation, when a code error is detected by the CRC detector 330, the buffer controller 832 holds the contents of the memory 831, reads the held data from the memory 831 upon combining the retransmitted data to be provided to the combiner 820 through the weighting portion 840.

The combiner 820 provides the weighted data to the memory 831 after combining the weighted data and the retransmitted data. The turbo decoder 830 performs the turbo decoding of the combined data. Thus, the HARQ can be performed without newly adding a buffer.

Embodiment (13)

Figure 28:
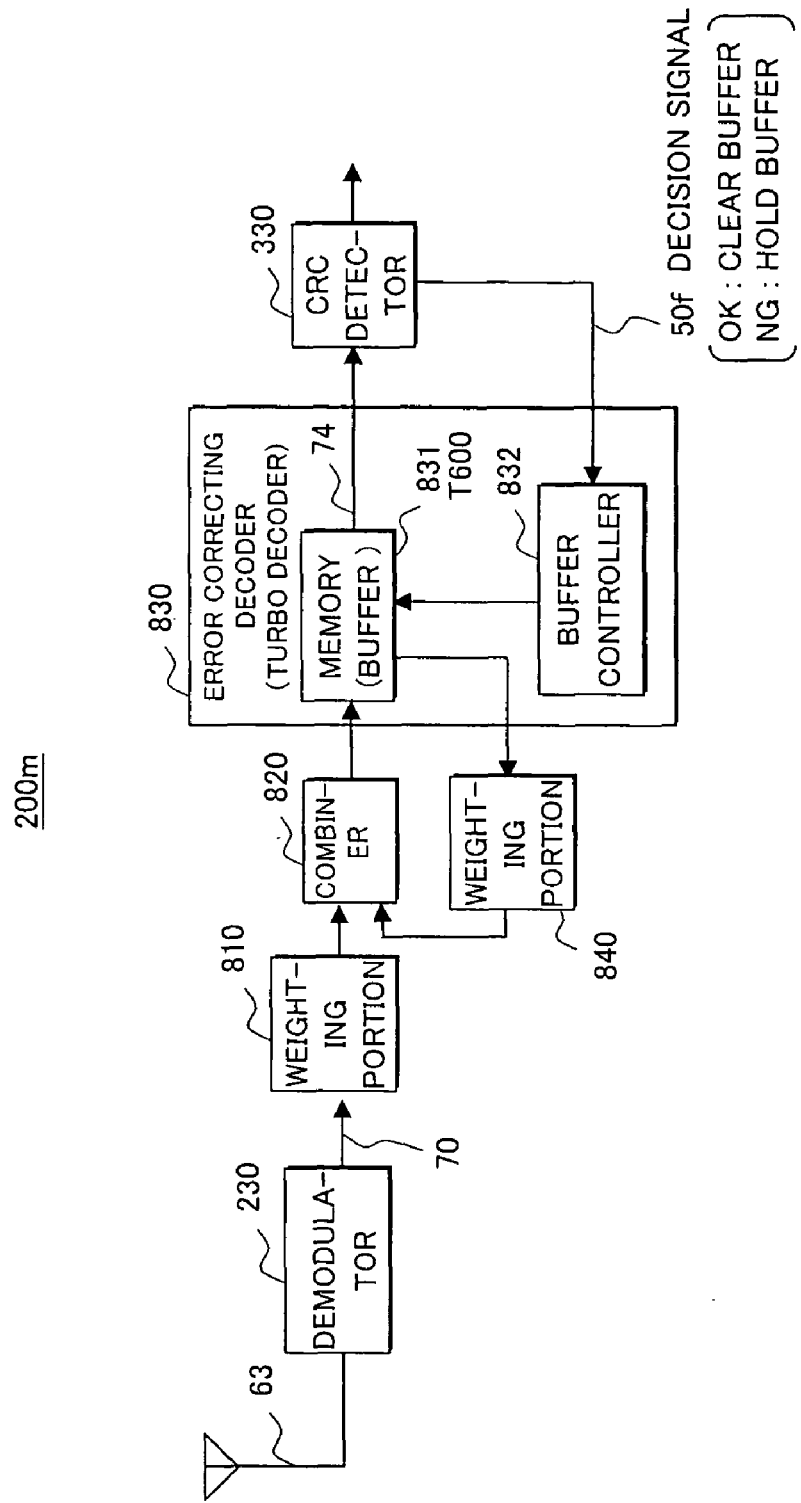
FIG. 28 is a block diagram showing an embodiment (13) of an error control apparatus according to the present invention.

FIG. 28 shows an embodiment (13) of an error control apparatus 200m of the present invention. This embodiment (13) uses the reception data storing memory 831 within the turbo decoder 830 as the HARQ buffer in the same way as the embodiment (12) shown in FIG. 27, thereby reducing the memory capacity of the buffer.

The embodiment (13) adopts more general communication method than the embodiment (12), which shows an example in which the demodulation is not restricted to a de-spreading method, and the deinterleaving and the rate matching are not performed.

Accordingly, the arrangement of the error control apparatus 200m does not include the de-spreader 210, the rake combiner 220, the deinterleaver 240, the bit separator, the second rate matching portion 260, the first rate matching portion 280, and the bit collector 290 shown in the embodiment (12), and the demodulator 230 and the weighting portion 810 are directly connected.

Thus, the HARQ can be performed without adding a new buffer.

As described above, an error control apparatus according to the present invention is arranged such that a buffer stores hard decision result data or soft output data instead of soft decision information, and the stored data are re-encoded to be provided to a combiner, or the number of bits of the data stored in the buffer is restricted, or a memory included in a decoder is used as an HARQ buffer. Thus, it becomes possible to reduce a required memory capacity of the buffer.

What is claimed is:

1. An error control apparatus comprising:
an error correcting decoder correcting an error of encoded data to be decoded into hard decision result data;
a buffer storing the hard decision result data; a code error detector detecting whether or not an error is present in the hard decision result data, and requesting a retransmission of the encoded data in a presence of the error;
a re-encoder encoding the hard decision result data into re-encoded data by a same error correction encoding method as that used for correcting the error of the encoded data; and
a combiner providing the error correcting decoder with encoded data in which the retransmitted encoded data and the re-encoded data are combined.

2. The error control apparatus as claimed in claim 1, wherein the error correcting decoder and the re-encoder respectively comprise a turbo decoder and a turbo encoder.

3. The error control apparatus as claimed in claim 1, further comprising a first weighting portion weighting the encoded data retransmitted to be provided to the combiner, and a second weighting portion weighting the re-encoded data to be provided to the combiner.

4. An error control apparatus comprising:
an error correcting decoder correcting an error of encoded data to be decoded into soft output data and hard decision result data;
a buffer storing the soft output data;
a code error detector detecting whether or not an error is present in the hard decision result data, and requesting a retransmission of the encoded data in a presence of the error;
a soft input soft output encoder encoding the soft output data into re-soft-encoded data by an encoding method corresponding to a decoding method of the error correcting decoder; and
a combiner providing the error correcting decoder with encoded data in which the retransmitted encoded data and the re-soft-encoded data are combined.

5. The error control apparatus as claimed in claim 4, wherein the soft input soft output encoder is provided with an error correcting encoder performing, to a code, a calculation equivalent to that of an error correcting encoder on a transmitting side corresponding to the error correcting decoder by using a sign/absolute value separating circuit which separates the soft output data into the sign and an absolute value thereof and a multiplier outputting the soft encoded data by multiplying an encoded result of the error correcting encoder by the absolute value.

6. The error control apparatus as claimed in claim 4, wherein the soft input soft output encoder has an error correcting encoder performing, to a sign and an absolute value addition result, a calculation equivalent to that of an error correcting encoder on a transmitting side corresponding to the error correcting decoder by using a sign multiplier/absolute value adder which performs a multiplication of the sign of the soft output data and an addition of the absolute value.

7. The error control apparatus as claimed in claim 4, wherein the soft input soft output encoder has an error correcting encoder performing, to a multiplication result, a calculation equivalent to that of an error correcting encoder on a transmitting side corresponding to the error correcting decoder by using a multiplier which performs a multiplication of the soft output data.

8. The error control apparatus as claimed in claim 4, further comprising a first weighting portion weighting the encoded data retransmitted to be provided to the combiner, and a second weighting portion weighting the re-soft-encoded data to be provided to the combiner.

9. An error control apparatus comprising:
a bit separator separating first encoded data into a first systematic bit and a parity bit;
a code error detector detecting whether or not an error is present in hard decision result data, and requesting a retransmission of the first encoded data in a presence of the error;
a systematic bit combiner combining the first systematic bit of the first encoded data retransmitted and soft output data to obtain a second systematic bit;
a bit collector multiplexing the second systematic bit and the parity bit into second encoded data;
an error correcting decoder correcting an error of the second encoded data to be decoded into the soft output data and the hard decision result data; and
a buffer storing the soft output data.

10. The error control apparatus as claimed in claim 9, further comprising a first weighting portion weighting the first systematic bit of the first encoded data retransmitted to be provided to the combiner, and a second weighting portion weighting the soft output data to be provided to the combiner.

11. An error control apparatus comprising:
a bit separator separating first encoded data into a first systematic bit and a parity bit;
a bit restricting portion outputting a second systematic bit in which a number of bits of the first systematic bits is restricted;
a buffer storing the second systematic bit;
a code error detector detecting whether or not an error is present in hard decision result data, and requesting a retransmission of the first encoded data in a presence of the error;
a systematic bit combiner combining the first systematic bit of the first encoded data retransmitted and the second systematic bit to obtain a third systematic bit;
a bit collector multiplexing the third systematic bit and a parity bit of the first encoded data retransmitted into second encoded data; and
an error correcting decoder correcting an error of the second encoded data to be decoded into hard decision result data.

12. The error control apparatus as claimed in claim 11, further comprising a first weighting portion weighting the first systematic bit of the first encoded data retransmitted to be provided to the combiner, and a second weighting portion weighting the second systematic bit to be provided to the combiner.

13. An error control apparatus comprising:
a combiner to combine encoded data with encoded data retransmitted in a first retransmission of the encoded data to generate combined data;
an error correcting decoder to decode the combined data;
an error detector to detect whether an error is present or not in the decoded combined data for requesting a second retransmission of the encoded data in a presence of the error;
a bit restricting portion to output data in which a number of bits of the combined data is restricted;
a buffer to store the data output by the bit restricting portion so that the stored data is combined by the combiner with encoded data retransmitted in the second transmission.

14. The error control apparatus as claimed in claim 13, further comprising a first weighting portion weighting the first encoded data retransmitted to be provided to the combiner, and a second weighting portion weighting the second encoded data to be provided to the combiner.

15. An error control apparatus comprising:
an error correcting decoder having a memory storing first encoded data received and correcting an error of the first encoded data to output hard decision result data decoded;
a code error detector detecting whether or not an error is present in the hard decision result data, and requesting a retransmission of second encoded data in a presence of the error;
and a combiner providing the memory with third encoded data in which the second encoded data retransmitted and the first encoded data stored in the memory are combined.

16. An error control apparatus comprising:
a bit separator to separate encoded data into a first systematic bit and a first parity bit and to separate encoded data retransmitted in a first retransmission into a second systematic bit and a second parity bit;
a systematic bit combiner to combine a systematic bit obtained from the first systematic bit by bit restricting with the second systematic bit to generate combined systematic bit;
a bit collector to multiplex the combined systematic bit and the second parity bit to obtain multiplexed data;
an error correcting decoder to decode the multiplexed data;
an error detector to detect whether an error is present or not in the decoded multiplexed data for requesting a second retransmission of the encoded data in a presence of the error;
a bit restricting portion to output a systematic bit in which a number of bits of the combined systematic bits is restricted; and
a buffer to store the systematic bit output by the bit restricting portion so that the stored systematic bit is combined by the systematic bit combiner with third systematic bit obtained by the bit separator by separating encoded data retransmitted in the second retransmission.

17. A error correcting apparatus comprising:
an error correcting decoder to decode encoded data to obtain decoded data by hard decision;

an error detector to detect whether an error is present or not in the decoded data for requesting a retransmission of the encoded data in a presence of an error;

a re-encoder to encode the decoded data by a same error correction encoding method as that used for correcting the error of the encoded data; and a combiner to provide the error correcting decoder with combined data which is obtained by combining retransmitted encoded data and the re-encoded decoded data to decode the combined data.

* * * * *